US 6,663,973 B1

(12) United States Patent
Lee et al.

(10) Patent No.: US 6,663,973 B1
(45) Date of Patent: *Dec. 16, 2003

(54) LOW DIELECTRIC CONSTANT MATERIALS PREPARED FROM PHOTON OR PLASMA ASSISTED CHEMICAL VAPOR DEPOSITION AND TRANSPORT POLYMERIZATION OF SELECTED COMPOUNDS

(75) Inventors: Chung J. Lee, Fremont, CA (US); Hui Wang, Fremont, CA (US); Giovanni Antonio Foggiato, Morgan Hill, CA (US)

(73) Assignee: Canon, USA, Inc., Lake Success, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/468,378

(22) Filed: Dec. 20, 1999

Related U.S. Application Data

(62) Division of application No. 08/957,480, filed on Oct. 24, 1997, now Pat. No. 6,051,321.

(51) Int. Cl.⁷ ............................. B32B 9/04; C08J 7/04
(52) U.S. Cl. .................. 428/447; 427/489; 427/515; 428/450
(58) Field of Search ................... 427/489, 515; 428/447, 450

(56) References Cited

U.S. PATENT DOCUMENTS

| | | |
|---|---|---|
| 3,268,599 A | 8/1966 | Chow et al. |
| 3,274,267 A | 9/1966 | Chow |
| 3,342,754 A | 9/1967 | Gorham |
| 3,440,277 A | 4/1969 | Holland et al. |
| 4,291,244 A | 9/1981 | Beach et al. |
| 4,532,369 A | 7/1985 | Hartner |
| 4,618,878 A | 10/1986 | Aoyama et al. |

(List continued on next page.)

FOREIGN PATENT DOCUMENTS

| | | |
|---|---|---|
| EP | 0 769 788 A2 | 4/1997 |
| JP | 60231442 | 11/1985 |
| WO | WO 97/14666 | 4/1997 |
| WO | WO 9715699 | 5/1997 |
| WO | WO 97/15951 | 5/1997 |
| WO | WO 98/24743 | 6/1998 |
| WO | WO 98/41490 | 9/1998 |

OTHER PUBLICATIONS

Jozef Bicerano, Prediction of Polymer Properties, Second Edition, Marcel Dekker, Inc. pp. 1–15, 50–61, 108–111, and 280–295. (1996).

Kudo, et al., Characteristics of Plasma–CF Films for Very Low–K Dielectrics, Feb. 10–11, 1997, DUMIC conference, 1997 ISMIC—222D/97/0034, 85–92.

Labelle, et al., Characterization of Pulsed–Plasma Enhanced Chemical Vapor Deposited Fluorocarbon Thin Films, Feb. 10–11, 1997 DUMIC Conference, 1997 ISMIC—222D/97/ 0034, 98–105.

(List continued on next page.)

*Primary Examiner*—D. S. Nakarani
(74) *Attorney, Agent, or Firm*—Fliesler Dubb Meyer & Lovejoy LLP

(57) ABSTRACT

Intermetal dielectric (IMD) and interlevel dielectric (ILD) that have dielectric constants (K) ranging from 2.0 to 2.6 are prepared from plasma or photon assisted CVD (PACVD) or transport polymerization (TP). The low K dielectric (LKD) materials are prepared from PACVD or TP of some selected siloxanes and F-containing aromatic compounds. The thin films combine barrier and adhesion layer functions with low dielectric constant functions, thus eliminating the necessity for separate adhesion and barrier layers, and layers of low dielectric constant. The LKD materials disclosed in this invention are particularly useful for <0.18 μm ICs, or when copper is used as conductor in future ICs.

21 Claims, 12 Drawing Sheets

U.S. PATENT DOCUMENTS

| | | | |
|---|---|---|---|
| 4,737,379 | A | 4/1988 | Hudgens et al. |
| 4,911,992 | A | 3/1990 | Haluska et al. |
| 5,139,813 | A | 8/1992 | Yira et al. |
| 5,210,341 | A | 5/1993 | Dolbier, Jr. et al. |
| 5,268,202 | A | 12/1993 | You et al. |
| 5,324,813 | A | 6/1994 | Hougham et al. |
| 5,334,454 | A | 8/1994 | Caporiccio et al. |
| 5,424,097 | A | 6/1995 | Olson et al. |
| 5,534,068 | A | 7/1996 | Beach et al. |
| 5,536,317 | A | 7/1996 | Crain et al. |
| 5,536,319 | A | 7/1996 | Wary et al. |
| 5,536,321 | A | 7/1996 | Olsen et al. |
| 5,536,322 | A | 7/1996 | Wary et al. |
| 5,536,892 | A | 7/1996 | Dolbier, Jr. et al. |
| 5,538,758 | A | 7/1996 | Beach et al. |
| 5,556,473 | A | 9/1996 | Olson et al. |
| 5,637,395 | A | 6/1997 | Uemura et al. |
| 5,650,041 | A | 7/1997 | Gotoh et al. |
| 5,783,614 | A | 7/1998 | Chen et al. |

OTHER PUBLICATIONS

Lang, et al. Vapor Deposition of Very Low K Polymer Films, Poly(Naphthalene), Poly(Fluorinated Naphthalene), Mat. Res. Soc, Symp. Proc., vol. 381, 45–50, 1995.

McClatchie, et al., Low DielectricConstant Flowfill Technology for IMD Applications, Feb. 10–11, 1997, DUMIC Conference, 1997 ISMIC—222D/97/0034, 34–40.

Robles, et al., Characterization of High Density Plasma Chemical Vapor Deposited—Carbon and Fluorinated Carbon Films for Ultra Low Dielectric Applications, Feb. 10–11, 1997 DUMIC Conference, 1997 ISMIC—222D/97/0034, 26–33.

Sharangpani, et al., Advantages of Chemical Vapor Deposition Over Conventional Techniques for the Processing of Amorphous Teflon Fluoropolymer, Feb. 10–11, 1997 DUMIC Conference, 1997 ISMIC–222D/97/0034, 117–120.

Shimogaki, et al., How Low Dielectris Constant of F–Doped SiO2 Films Ca n Be Obtained, Feb. 10–11, 1997, DUMIC Conference, 1997 ISMIC–222D/97/0034, 189–196.

Sugahara, et al., Low Dielectric Constant Carbon Containing SiO2 Films Deposited by PECVD Technique Using a Novel CVD Precursor, Feb. 10–11, 1997 DUMIC Conference, 1997 ISMIC–222D/97/0034, 19–25.

Tamura, et al., Preparation of Stable Fluorine–Doped Silicon Oxide Film by Biased Helicon Plasma CVD, Feb. 10–11, 1997, DUMIC Conference, 1997 ISMIC—222D/97/0034, 231–238.

Selbrede, et al., Characterization of Parylene–N Thin Films for Low Dielectric Constant VLSI Applications, Feb. 10–11, 1997, DUMIC Conference, 1997 ISMIC—222D/97/0034, 121–124.

Wang, et al., Parylene–N Thermal Stability Increase by Oxygen Reduction–Low Substrate Temperature Deposition, Preannealing, and PETEOS Encapsulation, Feb. 10–11, 1997, DUMIC Conference, 1997 ISMIC– 222D/97/0034, 125–128.

Wary, et al., Polymer Developed to be Interlayer Dielectric, Semi–Conductor International, 211–216, Jun. 1996.

FIG. — 1

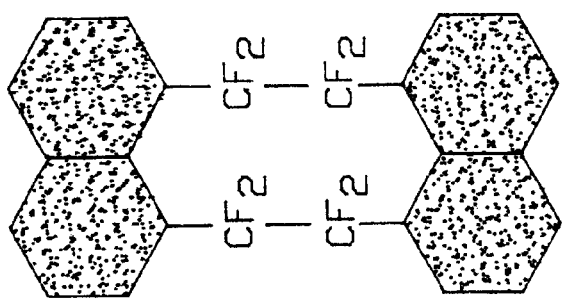
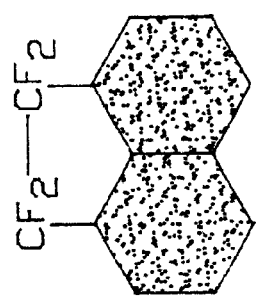
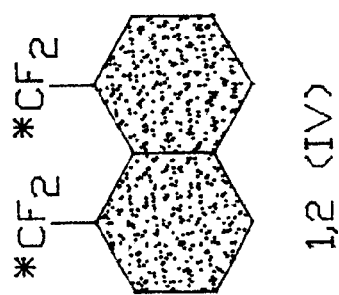
FIG. -3

LOW DIELECTRIC CONSTANT MATERIALS PREPARED FROM PHOTON OR PLASMA ASSISTED CHEMICAL VAPOR DEPOSITION AND TRANSPORT POLYMERIZATION OF SELECTED COMPOUNDS

CROSS REFERENCE

This Application of a Divisional of U.S. patent application Ser. No. 08/957,480, filed Oct. 24, 1997, now U.S. Pat. No. 6,051,321.

Lee et al., Precursors for Making Low Dielectric Constant Materials with Improved Thermal Stability: Ser. No.: 08/957,481, filed Oct. 24, 1997, now U.S. Pat. No. 6,020,458, issued Feb. 1, 2000.

Lee et al. Chemicals and Processes for Making Fluorinated Poly(Para-Xylylenes): Ser. No. 08/957,792, filed Oct. 24, 1997, now U.S. Pat. No. 6,140,456, issued Oct. 31, 2000.

Lee et al., New Deposition Systems and Processes for Transport Polymerization and Chemical Vapor Deposition: Ser. No. 08/958,352, filed Oct. 24, 1997, now U.S. Pat. No. 6,086,679, issued Jul. 11, 2000.

Lee et al., Low Dielectric Constant Materials with Improved Thermal and Mechanical Properties. Ser. No. 08/958,057, filed Oct. 24, 1997, now U.S. Pat. No. 6,323,297, issued Nov. 27, 2001.

This application is a divisional of U.S. Pat. No. 6,051,321, issued Apr. 18, 2001.

FIELD OF THE INVENTION

This invention is related to chemical compositions and methods for preparing materials that have low dielectric constants LKD. These low K materials, LKD, are prepared by photon assisted and/or plasma enhanced transport polymerization or chemical vapor deposition of some selected siloxanes and F-containing aromatic compounds. The LKD materials are particularly useful for manufacturing integrated circuits that have features smaller than 0.18 $\mu$m.

BACKGROUND OF THE INVENTION

For the past 20 years, the integrated circuit (IC) device density has doubled in about every 18 months. When the gate length of integrated circuits is less than 0.18 $\mu$m, the propagation time or delay time is dominated by interconnect delay instead of device gate delay. As the distance between metal lines decreases, the need for materials which can protect the integrity of the circuits also increases.

Aluminum and copper are the metal of choice for manufacture of integrated circuits with feature sizes of less than 0.18 $\mu$m. Furthermore, as methods for etching copper are developed, integrated circuits with feature sizes of less than 0.13 $\mu$m can be made using copper damascene along with LKD materials.

1. Packaging of Integrated Circuits

When aluminum or copper is used in integrated circuits, titanium nitride (TiN) is used as barrier layer to improve interfacial adhesion between metal and $SiO_2$ dielectric materials and to prevent corrosion of the metal by the wet chemicals used during semiconductor processing or from fluorine liberated from fluorinated $SiO_2$ or other fluorinated polymers in the low dielectric polymer films. Corrosion results in the migration of metal ions from the metal line into the surrounding dielectric material. This results in increased leakage of current from the metal line into the adjacent circuit components, degrading circuit performance. Thus, one purpose of the glue layer or barrier layer is to prevent migration of metal ions from the metal lines. If TiN is used as a barrier layer, it must be about 200 Å to about 300 Å in thickness to be effective to protect against metal corrosion and degradation of circuit performance. Because metal lines are close together, the distance between them is limited by the thickness of the barrier layer (2×200 Å=400 Å) and by the intervening low dielectric material. In an integrated circuit with 0.13 $\mu$m feature size, the thickness of the barrier layer of 400 Å leaves only 900 Å of space available for the low dielectric material. Moreover, as the space available for dielectric material decreases, there is the increased likelihood of gaps or voids being formed in the dielectric layers, further degrading circuit performance. Therefore, currently there is a need for new ways of protecting metal lines from corrosion while still maintaining proper dielectric efficiency.

Moreover, when the metal gap is equal to or smaller than 0.13 $\mu$m and when copper is used as conductor, the dielectric effectiveness of currently available materials is so limited that TiN or any other currently available metal barrier will become unsuitable for protecting against metal corrosion. Furthermore, the potential interfacial corrosion problem for copper will be even more severe than for aluminum.

To address this problem and others, new adhesion layer and barrier layer materials with low dielectric constants are being developed. Organic polymers are considered an improvement over inorganic low dielectric materials because the K of organic polymers can be as low as 2.0. However, most of the currently available organic polymers have serious problems. Specifically, they are not sufficiently effective as barrier layers.

A. Siloxane Containing Polymers for Packaging Integrated Circuits

In the 1980s, very extensive studies have been conducted to find hermetic packaging technologies for copper that used in Multi-Chip Modules (MCM). Due to their excellent electrical and thermal properties, polysiloxanes are among the most prevalent materials currently used in the encapsulation of electronic components. It has been found that only silicone gels and some siloxane containing polymers can prevent increases of leakage currents for encapsulated Triple Track Testers (TTT) under pressure cooker conditions. C. P. Wong, "High Performance Silicone Gels in IC Device Chip Encapsulation," *Mat. Res. Symp.* 108:175–187 (1988). However, most of the conventional polysiloxanes have either gel-like or rubbery in consistency, and therefore have limited applications in areas demanding high mechanical strength of the coating material.

The mechanisms for superior insulation property of siloxane-containing polymers are remained to be fully elucidated. It was rationalized though siloxanes are permeable to water vapor, they are perfect barriers for liquid water due to their high hydrophobicity. Their near zero water absorption can be attributed to the presence of siloxane derivatives presented in these polymers:

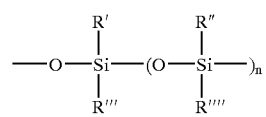

where R', R", R''', and R'''' are alkyl groups, such as —$CH_3$, and wherein n is an integer of from 1 to 5. Due to very high rotational and oscillatory freedom of the substituted siloxanes including R groups such as —$CH_3$, these siloxane groups can achieve very close contact with metal. The close contact prevents water from coming between the polymer and metal components thereby providing a watertight seal to prevent the degradation of critical circuit components by water. These siloxanes therefore are suitable for barrier layer materials.

B. Spin On Glass (SOG)

Currently, spin-on-glass (SOG) processes uses both organic and inorganic compounds as precursors. Organic precursors include siloxanes which contain many Si—$CH_3$ groups and inorganic siloxane precursors contain few Si—H groups. These precursors, produce polymer produce thin films having dielectric constants in the range of from about 2.7 to 3.0. However, a crack-free SOG dry film is only attainable when its thickness is less than 0.25 to 0.3 $\mu$m. Therefore, it is necessary to perform several sequential SOG steps to manufacture a layer of SOG that is thick enough (about 1 $\mu$m) to provide desirable sealing and dielectric properties. The total time needed to make SOG layers of this thickness is about 3 to 4 hours. This makes manufacturing SOG siloxane seals very inefficient. Furthermore, the SOG process is expensive due to the high losses (about 80% to 90%) of materials during spin coating.

These SOG deposited precursors also require post-deposition treatments at temperatures higher than 410° C. to reduce out gassing during deposition, reflow or annealing of metals. This high temperature treatment results in high residual stress, which ranges from about 200 to about 500 MPa at room temperature. High residual stress can cause delamination at dielectric materials and metal surfaces, and can crack metal features in integrated circuits. Therefore, chemical processes that can deposit other siloxane-containing polymers are desirable.

II. Precursors and Polymers for Manufacturing Low Dielectric Constant Materials During the past few years, several types of precursors have been used to manufacture polymers with low dielectric constants for use in manufacture of integrated circuits. Transport Polymerization (TP) and Chemical Vapor Deposition (CVD) methods have been used to deposit low dielectric materials. The starting materials, precursors and end products fall into three groups, based on their chemical compositions. The following examples of these types of precursors and products are taken from Proceedings of the *Third International Dielectrics for Ultra Large Scale Integration Multilevel Interconnect Conference* (DUMIC), Feb. 10–11 (1997).

A. Modification of $SiO_2$ by Carbon (C) and Fluorine (F)

The first method described is the modification of $SiO_2$ by adding carbon and/or fluorine atoms. McClatchie et al., *Proc. 3d Int. DUMIC Conference,* 34–40 (1997) used methyl silane ($CH_3$—$SiH_3$) as a carbon source, and when reacted with $SiH_4$ and the oxidant $H_2O_2$ and deposited using a thermal CVD process, the dielectric constant (K) of the resulting polymer was 3.0. However, this K is too high to be suitable for the efficient miniaturization of integrated circuits.

Sugahara et al., *Proc. 3d Int. DUMIC Conference,* 19–25 (1997) deposited the aromatic precursor, $C_6H_5$—Si—$(OCH_3)_3$ on $SiO_2$ using a plasma enhanced (PE) CVD process that produced a thin film with a dielectric constant K of 3.1. The resulting polymer had only fair thermal stability (0.9% weight loss at 450° C. in 30 minutes under nitrogen). However, the 30 min heating period is shorter than the time needed to manufacture complex integrated circuits. Multiple deposition steps, annealing, and metalizing steps significantly increase the time during which a wafer is exposed to high temperatures. Thus, this dielectric material is unsuitable for manufacture of multilevel integrated circuits.

Shimogaki et al., *Proc. 3d Int. DUMIC Conference,* 189–196 (1997) modified $SiO_2$ using $CF_4$ and $SiH_4$ with $NO_2$ as oxidant in a PECVD process The process resulted in a polymer with a dielectric constant of 2.6, which is much lower than that of $SiO_2$ (K=4.0). However, one would expect low thermal stability due to low bonding energy of $sp^3C$—F and $sp^3C$—Si bonds (BE=110 and 72 kcal/mol., respectively) in the film. The low thermal stability would result in films which could not withstand the long periods at high temperatures necessary for integrated circuit manufacture.

Siloxanes have been deposited using plasma dissociation processes (e.g., H. Yasuda, *Plasma Polymerization,* Academic Press (1985); M. Shen and A. T. Bell Editors: *Plasma Polymerization, ACS Symposium Series,* Vol.108, ACS (1979). These references are herein incorporated fully by reference. However, because these siloxane-containing polymers have low thermal stability, none of the mentioned siloxane polymers is adequate for IC fabrication meeting the requirements for small feature size.

B. Amorphous-Carbon ($\alpha$C)- and Fluorinated Amorphous Carbon (F-$\alpha$C)-Containing Low Dielectric Materials The second approach described involves the manufacture of $\alpha$-carbon and $\alpha$-fluorinated carbon films. Robles et al., *Proc. 3d Int. DUMIC Conference,* 26–33 (1997) used various combinations of carbon sources including methane, octafluorocyclobutane and acetylene with fluorine sources including $C_2F_6$ and nitrogen trifluoride ($NF_3$) to deposit thin films using a high density plasma (HDP) CVD process.

The fluorinated amorphous carbon products had dielectric constants as low as 2.2 but had very poor thermal stability. These materials shrank as much as 45% after annealing at 350° C. for 30 minutes in nitrogen.

Recently, LKD materials with dielectric constants as low as 2.5 were prepared by adding fluorinated aliphatic compounds into high density plasma chemical vapor deposition (HDPCVD). Highly cross-linked amorphous poly (tetrafluoroethylene) (PFTE; Teflon ™, registered tradename of DuPont Inc.) with a dielectric constant of 2.0 has also been made by plasma polymerization of $CF_{2=CF2}$. However, these materials have poor thermal stability.

One theory which could account for the low thermal stability of the fluorinated amorphous carbon products is the presence of large numbers of $sp^3C$—F and $sp^3C$—$sp^3C$ bonds in the polymers. These bonds have a bonding energy of 110 kcal/mol and 92 kcal/mol, respectively. Thus, the films cannot withstand the long periods of high temperatures necessary for IC manufacture.

Poly(para-xylylenes) or PPX have dielectric constants ranging from of 2.4 to 3.5. They can be deposited at low temperatures. The fluorinated PPX (F-PPX; Parylene-F™, a trademark of Special Coating Systems, Inc.) has greater thermal stability than cross-linked poly(tetrafluoroethylene) due to the presence of phenylene groups in the repeating units. However, like cross-linked poly(tetrafluoroethylene), decomposition of F-PPX will potentially cause corrosion of copper in integrated circuits. Decomposition liberates free fluoride ions ($F^-$), which can corrode circuit components. Therefore, there is a need for the development of new materials for sealing integrated circuit components.

III. Methods for Deposition of Materials with Low Dielectric Constant

The deposition of low dielectric materials onto wafer surfaces has been performed using spin on glass (SOG), but for newer devices which have features smaller than 0.25 $\mu$m, SOG prowesses cannot fill the small gaps between features. Therefore, vapor deposition methods are preferred. Of these, transport polymerization (TP) and chemical vapor deposition (CVD) are most suitable.

Commercial organic and inorganic spin on glass (SOG) methods deposit mostly low molecular weight siloxanes. They have disadvantages for integrated circuit manufacture. SOG processes generate waste solvents and also have low deposition efficiencies, resulting in wasting of materials and increased cost of final products.

In both TP and CVD, in contrast, the precursor molecule is dissociated (or cracked) to yield a reactive radical intermediate. The reactive intermediate contains at least one unpaired electron which upon deposition onto the wafer can bind with other reactive intermediate molecules to form a polymer. The polymer thus forms a thin film of material on the substrate. These processes are more efficient at utilizing precursors than are SOG processes. No extra precursors are needed to overcome the losses due to material spinning off of the wafer. Thus, transport polymerization and chemical vapor deposition are more desirable than SOG processes for depositing sealants to integrated circuits.

A. Chemical Vapor Deposition

Chemical vapor deposition has been used to deposit thin films with low dielectric constant. Sharangpani and Singh, *Proc. 3d Int. DUMIC Conference*, 117–120 (1997) reported deposition of amorphous poly(tetrafluoroethylene) using a liquid injection system. A dispersion of PFTE is sprayed directly on a wafer substrate, which is exposed to ultraviolet light and light from tungsten halogen lamps. Unfortunately, PFTE has a low glass transition temperature (Tg) and cannot be used for IC fabrication requiring temperatures of greater than 400° C.

Labelle et al., *Proc. 3d Int. DUMIC Conference*, 98–105 (1997) reported using pulsed radio frequency (RF) plasma enhanced CVD (PECVD) process for deposition of hexafluoropropylene oxide. However, as with poly (tetrafluoroethylene), the resulting polymers have low Tg values and cannot withstand the high temperatures required for semiconductor processing.

Kudo et al., *Proc. 3d Int. DUMIC Conference*, 85–92 (1997) reported using a PECVD process for deposition of hydrocarbons including $C_2H_2(C_2H_2+C_4F_4)$.

Lang et al., *Mat. Res. Soc. Symp. Proc.* 381:45–50 (1995) reported thermal CVD process for deposition of poly (naphthalene) and poly(fluorinated naphthalene). Although polymers made from these materials have low dielectric constants, the polymers are very rigid, being composed of adjoining naphthalene moieties. Thus, they are prone to shattering with subsequent processing such as CMP.

Selbrede and Zucker, *Proc. 3d Int. DUMIC Conference*, 121–124 (1997) reported using a thermal TP process for deposition of Parylene-N™. The dielectric constant of the resulting polymer (K=2.65–2.70) also was not low enough. Furthermore, the decomposition temperature (Td) of the thin film was also too low to withstand temperatures greater than 400° C.

Wang et al., *Proc. 3d Int. DUMIC Conference*, 125–128 (1997) reported that annealing a deposited layer of poly (para-xylylene) increases the thermal stability, but even then, the loss of polymer was too great to be useful for future IC manufacturing.

Wary et al. (*Semiconductor International*, June 1996 pp: 211–216) used the precursor ($\alpha, \alpha, \alpha', \alpha'$, tetrafluoro-di-p-xylylene) and a thermal TP process for making polymers of the structural formula: $\{-CF_2-C_6H_4-CF_2-\}_n$. Films made from Parylene AF-4™ have a dielectric constant of 2.34 and have increased thermal stability compared to the hydrocarbon dielectric materials mentioned above. Under nitrogen atmosphere, a polymer made of Parylene AF-4™ lost only 0.8% of its weight over 3 hours at 450° C. However, the melting point of Parylene AF-4™ is about 400° C., which is too low for metal annealing. In addition, Parylene AF-4™ has poor adhesion to metal and its dimer precursor is too expensive and not readily available for future IC manufacturing.

All of the aforementioned references are hereby incorporated fully by reference.

B. Transport Polymerization

In contrast to a CVD process, transport polymerization (TP) (Lee, C. J., Transport Polymerization of Gaseous Intermediates and Polymer Crystal Growth. *J. Macromol. Sci.—Rev. Macromol. Chem.* C16:79–127 (1977–1978), avoids several problems by cracking the precursor in one chamber and then transporting the intermediate molecules into a different deposition chamber. By doing this, the wafer can be kept cool, so that metal lines are not disrupted, and multiple layers of semiconductor devices may be manufactured on the same wafer. Further, the conditions of cracking can be adjusted to maximize the cracking of the precursor, ensuring that very little or no precursor is transported to the deposition chamber. Moreover, the density of the transported intermediates may be kept low, to discourage re-dimerization of intermediates. Thus, the thin films of low dielectric material are more homogeneous and more highly polymerized than films deposited by CVD. Therefore, these films have higher mechanical strength and can be processed with greater precision, leading to more reproducible deposition and more reproducible manufacturing of integrated circuits.

SUMMARY OF THE INVENTION

Therefore, one objective of this invention is to develop novel dielectric thin films for integrated circuit manufacture.

Another objective of this invention is the manufacture of gradient thin films in which the composition of the polymer layer differs along the film's thickness to provide changes in dielectric constant.

Yet another objective of this invention is the manufacture of gradient thin films in which the composition of the polymer layer differs along the film's thickness to provide changes in thermal properties.

A further objective of this invention is the manufacture of gradient thin films in which the composition of the polymer layer differs along the film's thickness to provide changes in mechanical properties.

Another of the objectives of this invention is to provide LKD consists of sufficient amount siloxanes for hermetic protection of copper and other metals and materials.

An additional objective is to provide molecular structures with high rotational flexibility between the silicon atoms and the planar configurations of the aromatic moieties to permit tight bonding of the molecule to the substrate.

Another objective is to provide processes that result in low residual stress at polymer/metal interfaces.

Yet another objective is to provide LKD materials that have also sufficient thermal and mechanical properties.

Therefore, the invention discloses new precursors and methods for depositing materials with low dielectric constants.

In one aspect of this invention, precursors containing aromatic moieties containing $sp^2$—C—F bonds are deposited along with $SiO_2$ to provide thin films with low dielectric constant, high thermal stability, and high mechanical strength.

In another aspect of this invention, methods for transport polymerization and chemical vapor deposition using plasma energy sources are used to deposit novel thin films using siloxane and aromatic hydrocarbon precursors.

In yet another aspect of this invention, gradient films are made which comprise depositing different layers of low dielectric material sequentially, each layer comprising different compositions of precursors.

In this invention, the thin films are made with siloxanes and aromatic hydrocarbons selected to provide adhesion layer, barrier layer, and low dielectric layer functions.

In another aspect of this invention, the siloxanes contain molecular structures with high rotational flexibility between the silicon atoms and the planar configurations of the aromatic moieties to permit tight bonding of the molecule to the metal, thus providing the adhesion layer function.

In yet another aspect of this invention, the aromatic hydrocarbons are selected to provide low dielectric constant, high thermal stability, and high mechanical stability, thereby providing barrier and low dielectric layer functions.

In other aspect of this invention, the dielectric constant of these materials range from 2.0to 2.6.

In yet another aspect of this invention, the residual stress of these materials on copper ranges from 25 to 50 M Pa at room temperatures.

In a further aspect of this invention, These polymers form primarily 3-dimensional networks.

Other objects, aspects and advantages of this invention can be ascertained from the review of the additional detailed disclosure, the examples, the figures and the claims.

BRIEF DESCRIPTION OF THE FIGURES

FIG. 3 depicts structures of some side products of this invention.

DETAILED DESCRIPTION OF THE PREFERRED EMBODIMENT

Figure 1:
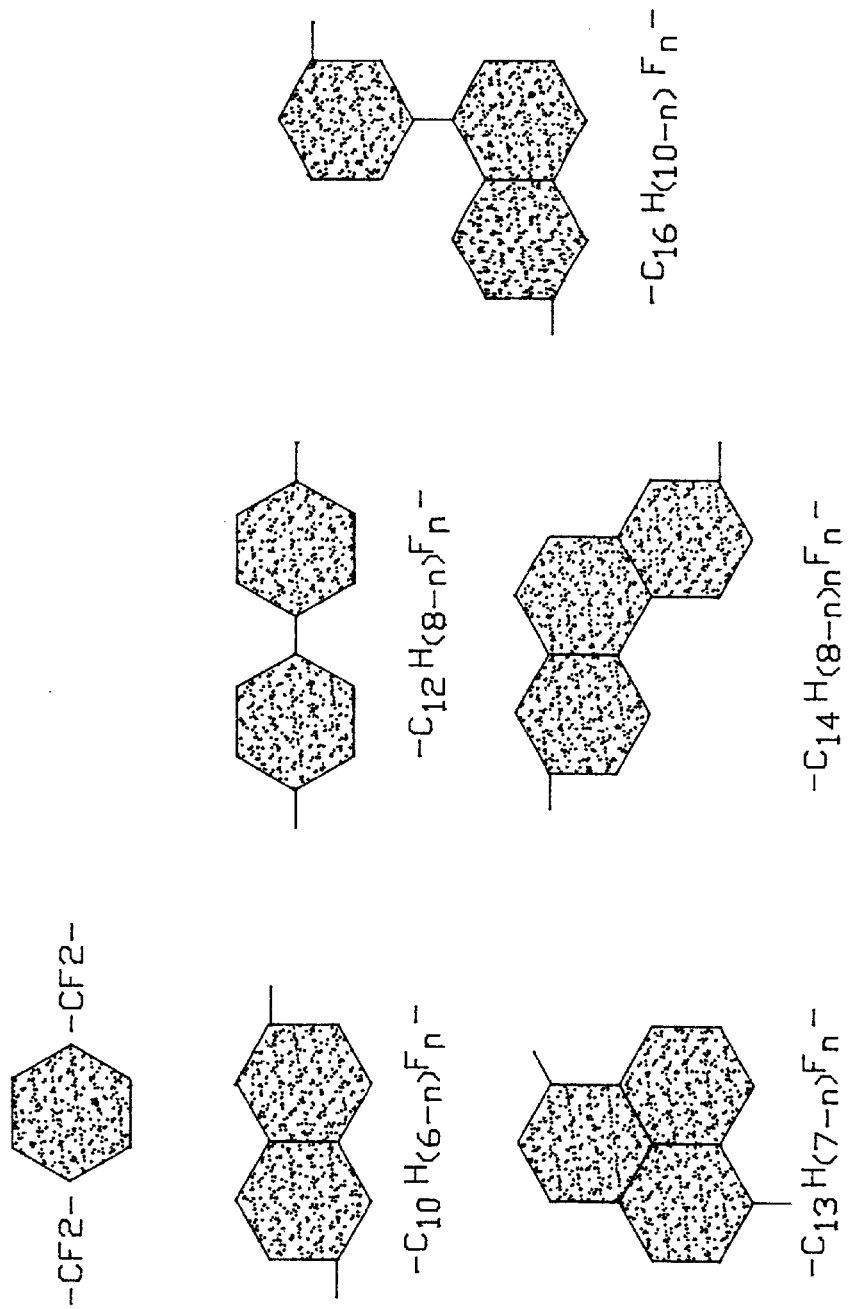
FIG. 1 depicts structures of some aromatic precursors of this invention.

In this invention, the adhesion and barrier layers made of titanium nitride, titanium oxynitride, or other conventional materials are replaced with siloxanes and aromatic hydrocarbons selected to provide adhesion layer, barrier layer, high thermal stability and low dielectric layer functions. The siloxanes contain molecular structures with high rotational flexibility between the silicon and oxygen atoms and the planar configurations of the aromatic moieties to permit tight bonding of the molecule to the metal, thus providing the adhesion layer function. The aromatic hydrocarbons are selected to provide low dielectric constant, high, thermal stability, and high mechanical stability, thereby providing barrier and low dielectric layer functions. The materials with low dielectric constant having high thermal stability and high elastic modulus (E) are prepared by plasma assisted or photon assisted transport polymerization or chemical vapor deposition of some selected siloxanes and fluorine-containing aromatic compounds. The dielectric constant of these materials range from 2.0 to 2.6. The residual stress of these materials on copper ranges from 25 to 50 M Pa at room temperatures. These polymers form primarily 3-dimensional networks.

I. Precursors

The precursors useful for this invention include selected siloxanes and F-containing aromatic compounds.

A. Siloxane Derivatives

The siloxane derivatives useful for this invention comprise the following chemical structures:

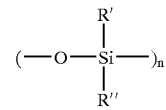

where R' and R" are fluorinated alkyl groups; or aromatic mono-, di-, trier tetra-radicals and their fluorinated derivatives. The siloxanes can be linear or cyclic compounds and n is an integer of at least 1. When n is from 3 to 5 and R' and R" are selected from the group consisting of —H, —CH$_3$, —CF$_3$, —(CH$_2$)$_n$—CF$_3$, —C$_2$H$_5$, —C$_6$H$_5$, —C$_6$(CF$_3$)H$_4$, various commercial siloxane products are available. Other useful siloxanes can be found in some textbooks, such as John Ziegler and F. W. Gordon Fearson, Ed. Silicon-Based Polymer Science *Adv. Chem. Series* No 224, ACS (1990). Although these siloxanes have been previously described, none of them has been used to replace a barrier layer or adhesion layer in the manufacture of integrated circuits.

The most useful siloxane derivatives include cyclic siloxanes, wherein n is between 2 and about 7, preferably about 4 to about 5, or wherein R' and R" are fluorinated alkyl groups, or are fluorinated aromatic groups described below. Siloxanes and fluorinated aromatic precursors have been used separately in plasma deposition of polymers, but not their admixtures for use in IC applications.

B. Fluorinated Aromatic Moieties

Aromatic precursors useful for this invention include compounds with the following structure: Y—Ar—(Y')$_z$, wherein the Ar is an aromatic compound consisting primarily of sp$^2$C to sp$^2$C and sp$^2$C—Y bonds, and wherein Y and Y' are a leaving groups selected from the group consisting of —H, —Cl, —Br, —NR, —SR, —SiR$_3$, —NR$_2$ and —SO$_2$R and wherein R is —H, an alky group or an aromatic mono-radical, and z is an integer ranging from 1 to 6. Some examples of the aromatic compounds are: C$_6$F$_n$H$_{(6-n)}$, CF$_3$—C$_6$F$_5$, CF$_3$—C$_6$F$_4$—CF$_3$, CF$_3$—C$_6$F$_4$—C$_6$F$_5$, CF$_3$—C$_6$F$_4$—C$_6$F$_4$ —CF$_3$, and C$_{10}$F$_8$.

Figure 2:
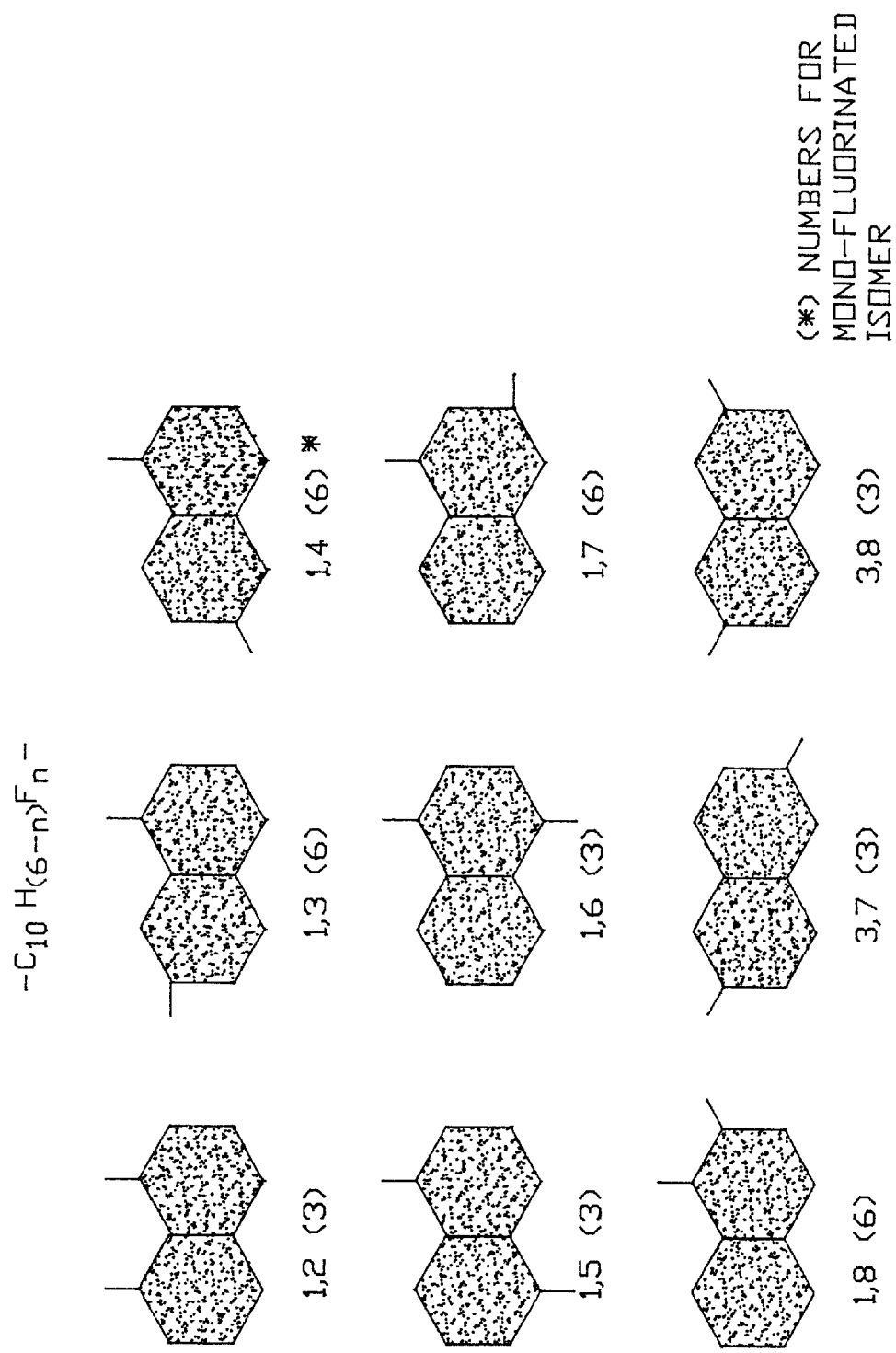
FIG. 2 depicts structures of some isomers of one of the precursors of this invention.

Additional aromatic structures can be found in the attached FIGS. 1 to 3. FIG. 1 depicts structures of some aromatic moieties useful for this invention. The moiety —$CF_2$—$C_6H_4$—$CF_2$—is used in poly(para-xylylene) Parylene™ (a trademark of Specialty Coating Systems, Inc.) as a material for manufacturing semiconductor thin films with low dielectric constants.

Other precursors of this invention contain aromatic moieties which have from more than about 6 to about 40 carbon atoms. Precursors of this invention can be classified according to the following formulas:

—$C_{10}H_{(6-n)}F_n$—, wherein n is an integer ranging from 0 to 6;

—$C_{12}H_{(8-n)}F_n$—, wherein n is an integer ranging from 0 to 8;

—$C_{13}H_{(7-n)}F_n$—, wherein n is an integer ranging from 0 to 7;

—$C_{14}H_{(8-n)}F_n$—, wherein n is an integer ranging from 0 to 8;

—$C_{16}H_{(10-n)}F_n$—, wherein n is an integer ranging from 0 to 10.

The di-phenylenyl moiety (—$C_{10}H_{(6-n)}F_n$—) where n is an integer of from 0 to 6 consists of two phenylenyl moieties covalently linked together. The anthracenyl (—$C_{14}H_{(8-n)}F_n$—) moiety wherein n is an integer of from 0 to 6, the phenanthrenyl (—$C_{14}H_{(8-n)}F_n$—) moiety wherein n is an integer of from 0 to 8, the 4-ring pyreneyl (—$C_{16}H_{(8-n)}F_n$—) moiety wherein n is an integer of from 0 to 8 are useful. Further, more complex aromatic structures such as a naphthenyl moiety connected to a phenylene moiety (—$C_{16}H_{(10-n)}F_n$—) wherein n is an integer from 0 to 10 are useful in this invention. Furthermore, a three-ring structure (—$C_{13}H_{(7-n)}F_n$—) also is useful.

Moreover, covalently linking similar or different aromatic residues together creates larger aromatic moieties. For example, linking phenyleneyl and naphthenyl residues into a phenyleneyl-naphthenyl naphthenyl moiety results in an aromatic moiety with the structural formula: ($C_6H_5F_n$)—($C_{10}H_{7-m}F_m$) where n and m are integers. Similarly, linking a phenanthrenyl residue and a pyreneyl residue results in an aromatic moiety with the structural formula: —($C_{14}H_{(8-n)}F_n$)—($C_{16}H_{(8-n)}F_n$)—. All such combinations of the aforementioned aromatic moieties which consist of up to about 40 carbon atoms are considered to be part of this invention.

Numerous positional isomers exist for each of the above formulas. The term positional isomer refers to the relative location of the radical-containing moieties on the aromatic groups. In addition to positional isomers, the location of the fluorine atoms also may be different for each of the positional isomers. For instance, when the aromatic group has the general formula: —$C_{10}H_{(6-n)}F_n$—, there are 9 and 39 positional isomers for n=0 and 1 respectively (see FIG. 2). For each of the positional isomers shown in FIG. 2, there are several fluorine-isomers. The number of these mono-fluoro-isomers is shown in parentheses. All partially or fully fluorinated aromatic moieties and all of the positional isomers are included in this invention.

However, not all of these positional isomers are equally useful in transport polymerization for the preparation of thin films for IC fabrication. Isomers, when formed into reactive intermediate di-radicals, may not form polymers at all. For example, for the (1, 2) isomer as shown in FIG. 2, the radical groups are too close together on the aromatic moiety, and the reactive intermediates will mostly form undesirable side products such as monomers and dimers (FIG. 3), and will not form polymers. When these monomers and dimers deposit on wafers along with polymers, the resulting thin films will be contaminated with liquid or powdered side products, and thereby becoming useless for integrated circuit fabrication. For the same reason, the (1, 8) isomer also is not useful.

These powdery dimers form on wafers when the vapor pressure is too high or/and its residence time, τ, inside the chamber is too long. Attempts to increase deposition rate by increasing the chamber pressure resulted in more dimer formation and concomitant loss of dielectric efficiency unless the residence time in the chamber is very low. The sufficiently short residence time needed to avoid powder formation on cold wafers can only be obtained by using small deposition chambers. Because the smallest chamber size is limited by the wafer diameter, the height of the chamber should be very small. Constraints on the dimensions of the chamber can lead to poor deposition patterns if the flow of intermediates is focused on a particular portion of the wafer. In some of the new deposition systems of co-pending application, the chamber is designed to accommodate devices which can re-distribute the flow pattern of intermediates onto the wafers. If the chamber is too small, there will be insufficient room to incorporate flow pattern adjusters or diffusion plates into the systems. Moreover, with small chamber dimensions, it is difficult to provide adequate devices for automated wafer handling.

On the another hand, intermediate di-radicals generated from the (1, 6) isomer will not form dimers because of the stearic hindrance of its bulky Ar group as shown in FIG. 3. For the same reason, except for the (1, 2) and (1, 8) isomers, other C-10 di-radicals will tend to not form side products on wafers even though they have a high residence time and/or under high vapor pressure. Therefore, these polymer precursors are favored for potentially getting much higher deposition rates.

Therefore, it is desirable to chose isomers in which the formation of dimers or monomers is not favored. By selecting the positional isomers such that the reactive groups are sufficiently far apart, dimer or monomer formation is minimized. It is desirable for the end-to-end length ($l_m$) to be at least 4 Å, and preferably, $I_m$ should be at least 6 Å. End-to-end length is calculated using bond angle and bond length of repeating units in the polymers.

Asymmetrical isomers with lower extended chain lengths will have higher G and E. However, symmetrical isomers have higher Tg due to the higher cohesive energy, which results from the more complete alignment of aromatic moieties. The more complete alignment results in closer approximation of π electrons in the adjacent aromatic moieties, which results in the formation of tighter π bonds being formed between adjacent aromatic moieties.

For the di-phenylene moiety, there are several positional isomers. In these positional isomers, the arrangement of the reactive groups can be para-para (pp), meta-para (mp), para-ortho (po), meta-ortho (mo), ortho-ortho (oo), para-meta (pm), or meta-meta (mm). Note that the oo positional isomer will be constrained to a trans-like configuration, wherein the two radical-containing moieties of Compound IV will not be close together. If they are too close together, they may form a monomer, which will contaminate the polymer. Fortunately, the oo monomer is highly unstable, and does not easily form.

Some of the naphthenyl ($C_{10}$) isomers, such as the (1, 5) and (3, 7) isomers, have a symmetric configuration, therefore they are likely to form highly crystalline polymers. For the same polymer, thin films with higher degrees of crystallinity have higher thermal stability, higher Elastic Modulus and higher $T_g$ and lower Coefficient of Thermal Expansion (CTE). For this reason, Parylene AF4™ deposited at higher wafer temperatures resulted in higher $T_g$ and E and lower CTE than those of films deposited at lower wafer temperatures.

When the aromatic compounds are used in conjunction with siloxanes, one theory which may account for the improved thermal stability and improved mechanical properties of the resulting materials is that the bond types present in the new materials have more cohesive energy than the bond types of other, previously used materials. First, $sp^2C=sp^2C$ bonds in aromatic compounds have much higher bond strength and cohesive energy than $sp^3Si$—$sp^3C$ or Si—C bonds in the siloxanes. For single bonds, the $sp^2C$—$sp^3C$ bond, or hyperconjugated C—C bond, the $sp^2C$—X, or hyperconjugated C—X bond both have higher bonding energy (BE) and cohesive energy than the $sp^3$ Si—$sp^3C$ and $sp^3$ Si—X bonds. This is due to the so called "hyperconjugation" effect. The hyperconjugation results from participation of the σ-bonds electrons of the C—C or C—X single bond in overlapping with the π-orbitals of a neighboring C=C double bond. The resonance stabilization of a single bond by a neighboring double bond increases its bonding strength. This is especially effective when the X is an electron withdrawing group such as fluorine atom. For the above reason, the bonding energy of the C=C—F bond is higher than that of the C—C—F and Si—F bonds. Examples of these bond energies are found in Table 1.

the atomic % of F content for thin films comprising $sp^2C$—F bonds. Thin films prepared from this invention can have K as low as 2.0–2.3 and excellent thermal stability.

Therefore, these new precursors can replace titanium nitride (TiN), TaN, WN, TaSiN, WSiN, and similar materials as barrier layers and adhesion layers. However, the use of these new precursors as barrier and adhesion layers requires the development of equipment for low temperature dissociation and deposition. The equipment used is described in the above-described co-pending applications.

II. Deposition of Precursors

The polymers and siloxane derivatives of this invention can be deposited using any conventional CVD or transport polymerization method which uses "cold dissociation" methods. As used herein, the term "cold dissociation" methods are those which do not appreciably heat the precursors. Such cold dissociation methods include photon assisted (PA) or plasma enhanced (PE) processes.

A. Photon Assisted Transport Polymerization

Photon assisted transport polymerization and chemical vapor deposition can use infrared (IR), ultraviolet (UV) or vacuum ultraviolet (VUV) sources, or combinations of the above. A desirable energy source is incoherent excimer

TABLE 1

| | Bond Type | | | | | | | | | |
|---|---|---|---|---|---|---|---|---|---|---|
| | $sp^3C$—Si | $sp^2C$—Si | $sp^3C$—$sp^3C$ | $sp^2C$—H | $sp^2C$—F | Si—O | $sp^2C$—$sp^3C$ | $sp^2C$=$sp^2C$ | $sp^3C$—F | Si—F |
| Bond Energy (BE) (kcal/mol) | 72 | 92 | 92 | 111 | 126 | 98 | 102 | 145 | 110 | 135 |

The date of Table 1 is taken from Streitwiesser et al., *Introduction to Organic Chemistry*, Appendix II, University of California Press, Berkeley, Calif. (1992), incorporated herein fully by reference. The bond energy (BE) of a $sp^3C$—X bond can be higher than that of a $sp^3Si$—X bond when X=H, C and S; however, its opposite is true when X=F, Cl and O. For instance, the BE of a $sp^3Si$—F bond is 135 kcal/mol. versus 110 kcal/mol. of a $sp^3C$—F bond. Despite its high BE, SiOF films consisting of more than 4.2 atomic-F % are found to be very unstable under pressure cooker conditions (Passemard et al. Fluorine Stability in Fluorosilicate Glass and Effects on Dielectric Properties, *Proceedings of the 2d DUMIC*, p 145, 1996). It has been theorized that due to higher reactivity of $sp^3Si$—F bonds towards fluorination comparing to Si—O bonds, plasma polymerization of precursors containing >4.2% fluorine result in SiOF films comprising mostly F—Si—F. (Takamura et al. Preparation of Stable Fluorine-Doped Silicon Oxide Film by Biased Helicon Plasma CVD, *Proceedings of the 2d DUMIC* p 231, 1996). Due to these reasons, stable SiOF films are limited to those having a dielectric constant of 3.5 or higher.

After polymerization, the $sp^3Si$—F bond in a F—Si—F group can be easily hydrolyzed due to the high polarity resulting from presence of the second fluorine on the group. Takamura et al., *Proceedings of the 2d DUMIC* p 231, (1996). Hydrolyzed Si—F bonds will release HF acids and corrode metals in integrated circuits.

In this invention, organic compounds consisting mostly of $sp^2C$—F bonds are used to lower dielectric constant of SiO containing films. The $sp^2C$—F bond has high thermal stability and excellent hydrolytic stability. Unlike for $sp^3Si$—F and $sp^3C$—F bonded moieties, there is no similar limit for radiation that is derived from a dielectric barrier discharge. UV and VWV photon energies that are in the range from about 3 to about 5 eV are especially useful.

One option of this invention is to first deposit on metal surfaces a layer of siloxanes ranging from 100 to 500 Å, then switch to deposition of fluorinated aromatic polymers. Another option is to deposit copolymers of siloxanes and fluorinated aromatic compounds by introducing admixtures of these two types of compounds with various mixing ratios. Additionally, gradients of polymers can be made by gradually changing the composition of the precursors introduced into the deposition system during deposition. Another option is to make a damascene dielectric structure with a top layer of PACVD siloxanes for better LKD to copper adhesion. In addition to equipment utilizing thermal methods for dissociating precursors, equipment utilizing electromagnetic radiation is useful for practicing this invention. Useful electromagnetic radiation is in the infrared (IR), ultraviolet (UV) and vacuum ultraviolet VUV) spectra. UV and VUV produce no heat, whereas IR produces heat. When used in combination, IR and either UV or VUV can dissociate precursors with increased efficiency.

1. Transport Polymerization Using Combined IR, UV, and VUV Sources

Figure 4:
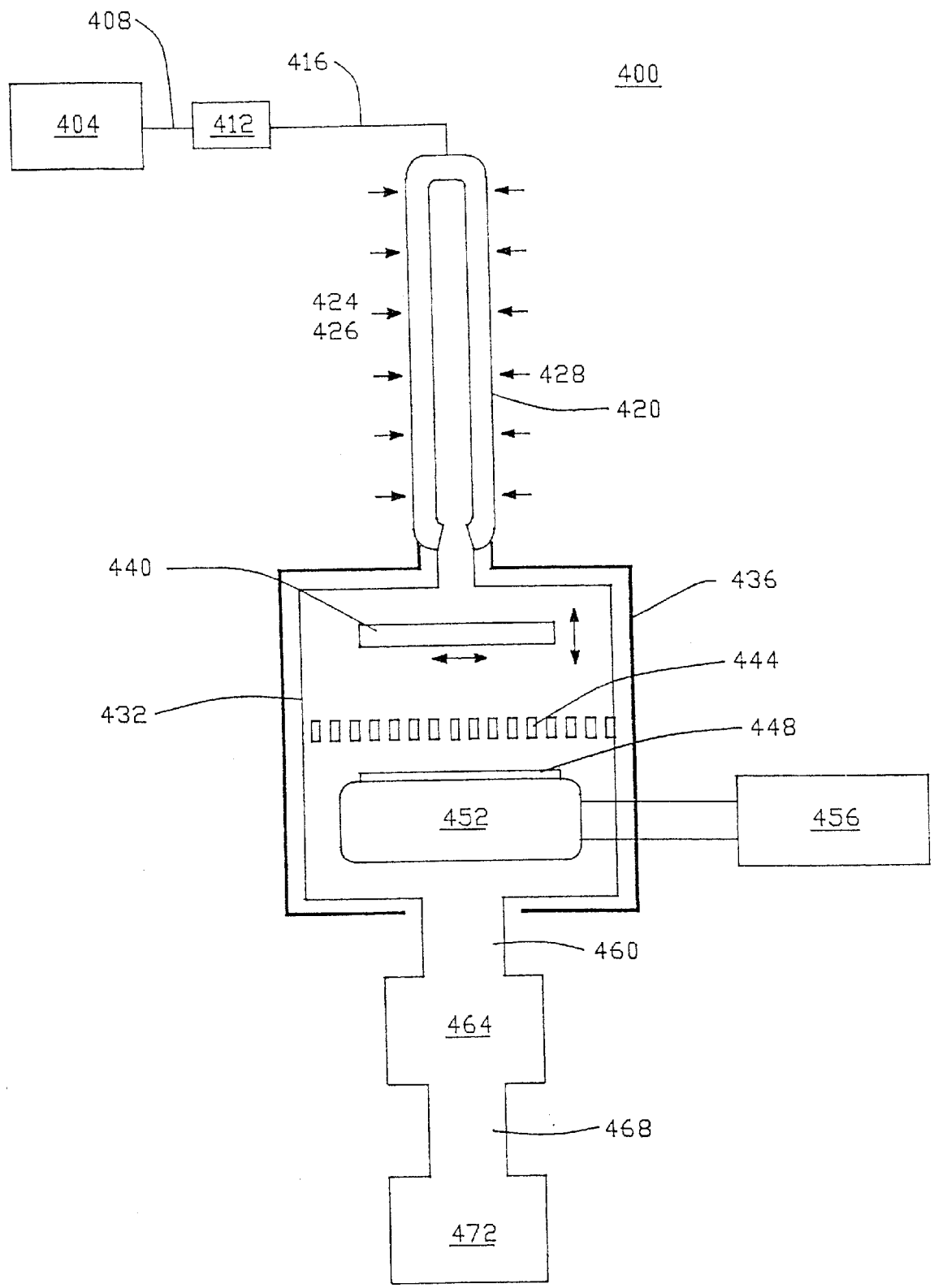
FIG. 4 is a schematic diagram of a transport polymerization system using electromagnetic radiation to dissociate precursors.

FIG. 4 is a schematic diagram of a transport polymerization system 400 using electromagnetic radiation as an energy source for cracking precursor molecules. Precursors are transported from the precursor tank 404 through a pipe 408 and through a mass flow controller 412 through another pipe 416 and into a tube 420 which is transparent to the types of electromagnetic radiation to be used. For IR irradiation, a glass tube is sufficient. For UV irradiation, quartz tubes are necessary, and preferably are made of a single crystal quartz.

For VUV irradiation, tubes made of $MgF_2$, LiF, or $CaF_2$ are necessary because the short wavelengths of VUV cannot pass easily through quartz.

In another embodiment of the invention, the electromagnetic energy source can be located at a site within the central area of flow of precursors. With this configuration, a large proportion of the electromagnetic energy is directed at the precursors as they flow past. This can increase the efficiency of precursor cracking.

After dissociating in tube 420, the reactive intermediates are transported into the deposition chamber 422 surrounded by a heater 436. The wall of the chamber is heated to decrease the deposition of molecules on the chamber wall. This heating can be accomplished by any conventional means, including, but not limited to resistive heating.

After entering chamber 432, the flow of intermediates is adjusted by a movable flow pattern adjustor 440. Vertical movement of the flow pattern adjustor 440 adjusts the flow rate of intermediates into the chamber 432 and aids in mixing the intermediates more evenly within the chamber 432. Horizontal movement of flow pattern adjustor 440 adjusts the flow distribution of intermediates over the wafer 448. The flow pattern adjuster can be a flat, stainless steel plate, or alternatively can be a porous or honeycomb structure. A gas dispersion plate 444 evens the flow of intermediates over the wafer 448. Dispersion holes between the flow pattern adjuster and the wafer ensure the dispersion of the intermediates. The wafer 448 is held by a mechanical or electrostatic cold chuck 452, which is cooled by any chiller 456 employing any conventional means, including, but not limited to liquid nitrogen or reverse Peltier effect. A UV or VUV source also can be directed toward the wafer 448 to permit cross-linking of polymers after their deposition. A pipe 460 is for exhausting the chamber 452, and a pump 472 connected via a pipe 468 to a trap 464 maintain the pressure within the chamber at desired levels.

Exemplary sources of UV radiation for transport polymerization can include (1) a mercury lamp that provides from 50 to 220 $mW/cm^2$ of UV ranging from 185 to 450 nm or (2) a metal halide lamp that provides from 40 to 160 $mW/cm^2$ of UV ranging from 256 nm to 450 nm. These UV sources provide photon energies ranging from 2 to 5 eV, which are sufficient for generating radical intermediates.

An alternative to conventional UV light is vacuum ultraviolet (VUV). (See Van Zant, *Microchip Fabrication*, 3d edition, McGraw Hill, New York, 1996). Incoherent excimer radiation can provide a large number of UV and VUV wavelengths for photolytic processing of various chemicals. The preferred source is incoherent excimer radiation derived from dielectric barrier discharge. UV and VUV photons that are in the ranges of 3 to 5 eV are especially useful. These energy levels are comparable with the bonding energies of most chemical bonds, thus are very effective for initiating photochemical reactions (see Table 1).

TABLE 2

| Bond Energies of Selected Bonds | |
| --- | --- |
| Chemical Bonds | Bonding Energies (eV) |
| φ-$CH_2$Br | 2.52 |
| φ-$CH_2$—OR | 3.52 |
| φ-$CH_2$—$CH_3$ | 3.30 |
| φ-$CH_2$—NH | 3.09 |
| φ-$CH_2$—F | 4.17 |

TABLE 2-continued

| Bond Energies of Selected Bonds | |
| --- | --- |
| Chemical Bonds | Bonding Energies (eV) |
| φ-$CH_2$—SR | 3.20 |
| φ-$CH_2$—H | 3.83 |

Table 2 shows the bonding energies in electron volts (eV) corresponding to certain bonds of this invention. This data is from Streitwiesser et al., *Introduction to Organic Chemistry, Appendix II*, University of California Press, Berkeley, Calif. (1992), incorporated herein fully by reference.

However, the energies of mercury vapor or metal halide UV radiation are too small to be useful for rapid transport polymerization. The desired residence time within the cracking chamber, which is the time available for photolysis should be in the range of a few milliseconds to several hundred milliseconds. Therefore, VUV is the most desirable form of energy for photon assisted transport polymerization.

VUV or incoherent excimer UV sources can be provided by dielectric barrier or silent discharge using a variety of gas or gas mixtures according to methods known in the art. For example, VWV can be generated using KrBr, $Ar_2$, ArCl, ArBr, $Xe_2$ and $F_2$ gases. Xe emits at 172 nm, Kr at 222 nm, and XeCl emits at 308 nm. As can be seen from Table 2, nearly all of the chemical bonds of interest in polymer manufacture can be broken using photolytic methods. Because excimer radiation is selective for the energy of the specific bonds, excimer radiation from a second source or alternatively, a plasma source may be used simultaneously if it is desired to break other bonds at the same time. Such a combination of excimer sources and plasma sources are useful to break bonds of precursors for making cross-linked poly(para-xylylenes). Because the leaving groups of these precursors can be different, it is desirable to break those bonds selectively to generate tri- and tetra-functional reactive intermediates.

Using photon-assisted processes of this invention, it is also possible to cross-link the novel polymers after their deposition. By directing the photons toward the surface of the polymer, the electromagnetic energy disrupts some of the C—F or C—H bonds, creating radicals, which can bond with nearby polymer chains, resulting in a cross-linked film of polymers. This can be accomplished by exposing the wafer to UV or VUV for several seconds up to several minutes.

2. Transport Polymerization Using Infrared (IR) Radiation

Figure 5:
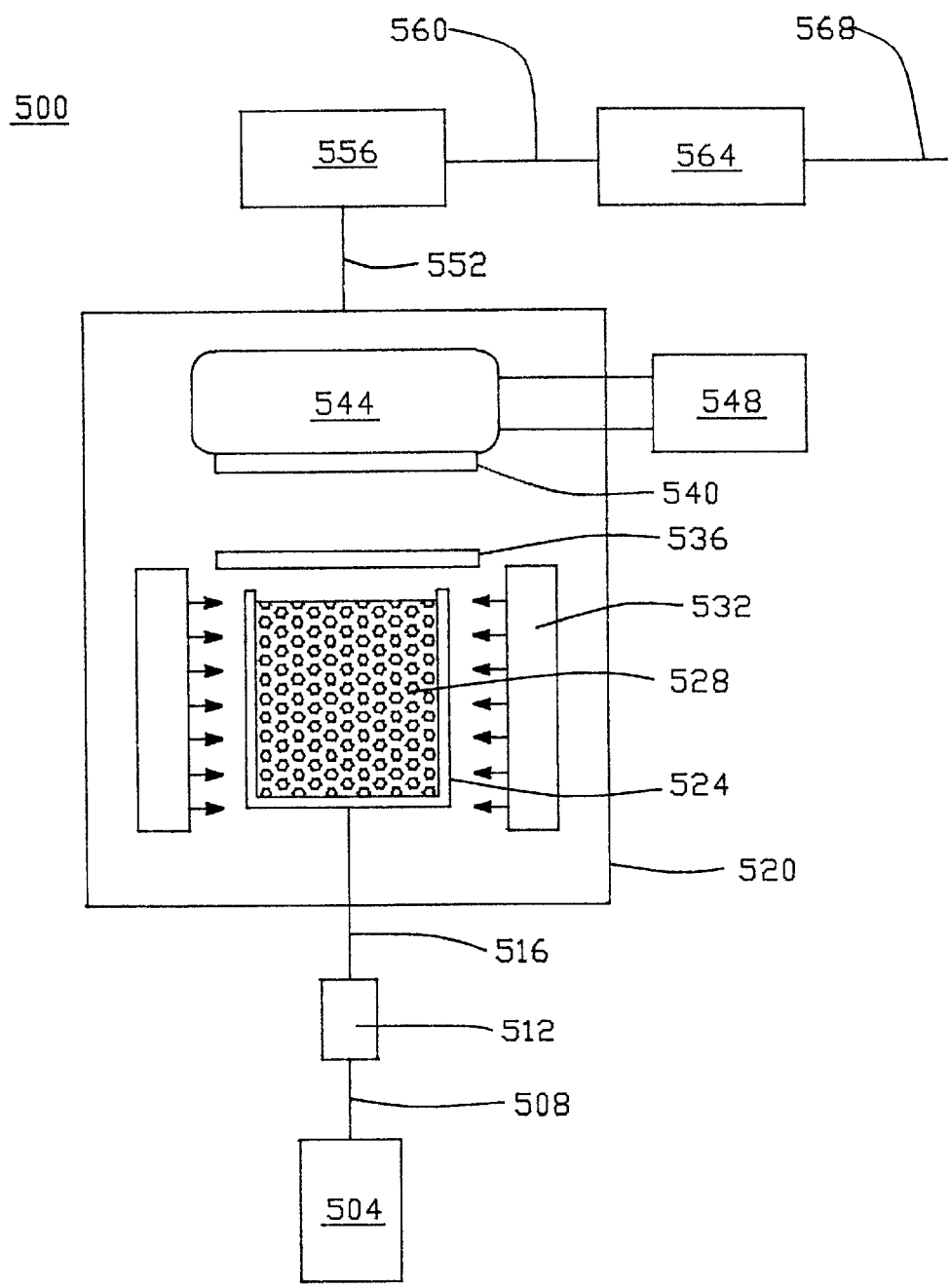
FIG. 5 is a schematic diagram of a transport polymerization equipment employing IR radiation.

An alternative transport polymerization equipment employing IR radiation 500 is shown in FIG. 5. The precursors are transported from a precursor holder 504 through a pipe 508 and through a mass flow controller 512 and a second pipe 516 into the chamber 520. The chamber contains a quartz chamber 524, optionally containing a catalyst 528. An infrared radiation source 532 is placed outside the quartz container 524, and the precursors are dissociated as they pass through the quartz container 524. A diffusion plate 536 is used to optimize the flow pattern of intermediates to the wafer 540. Optionally, a flow pattern adjuster as shown in FIG. 4 (440) may be used to adjust the flow of intermediates over the wafer 540. The wafer 540 is held on a mechanical or electrostatic cold chuck 544, which is cooled by a conventional chiller 548. The pressure in the chamber is maintained by a pump 564 connected via a pipe 560 to and a trap 556, which is connected to chamber 520 by a pipe 552. The trap 556 protect the pump from deposition of intermediates in the pump 561.

In IR radiation, a combination of both thermolytic and photolytic reactions are expected. Therefore, it is important to ensure that the IR power is in the range where the reactive intermediates can be dissociated, but where destruction of the polymer network does not occur. The IR power should be in the range of from 500 Watts to 3000 Watts, preferably from 1500 Watts to 2500 Watts, and most preferably 2000 Watts.

B. Plasma Enhanced Transport Polymerization

Plasma energy is also used to dissociate precursors into reactive intermediates. Plasma sources useful for this invention can be provided by various different kinds of equipment. Michael Lieberman and Allan Lichtenberg *Principles of Plasma Discharge and Material Processing*, Wiley Interscience, (1994). There are generally two types of energy sources for plasma enhanced transport polymerization or chemical vapor deposition. They are radiofrequency (RF) and microwave sources.

Plasma enhanced TP is carried out using the novel reactors described herein (FIGS. 6–9). With low density plasma, the electron density in the plasma is in the range of about $10^{12}$ to about $10^{13}$ electrons/cm$^3$. Low density plasma TP and CVD can be carried out at about 100 milliTorr to about 100 Torr. High density plasma (HDP) is characterized by electron densities in the range of about $10^{13}$ to about $10_{14}$ electrons/cm$^3$. High density plasma TP and CVD can be carried out at pressures of about 0.1 milliTorr to about 100 milliTorr. The higher electron density in HDP increases the formation of cross-linked polymers, because the higher energy density increases the numbers of tri-radical intermediates which can form cross-inks between polymer chains.

Several comprehensive reviews and texts have appeared on plasma polymerization which incorporate many of the methods currently in the art. Yasuda, *Plasma Polymerization*, Academic Press, 1985; d'Agostino, Ed.: *Plasma Deposition, Treatment and Etching of Polymers*, Academic Press, 1990; Hollahan and Bell, Ed., *Techniques and Applications of Plasma Chemistry*, John Wily and Sons, 1974; Morita et al, *Pure Appl. Chem.* 57:1277 (1985). Each of these is incorporated herein fully by reference.

C. Measurement of Polymer Properties

To describe the effects of polymer composition and process conditions on polymer properties, measurements of dielectric constant and polymer composition are measured and correlated with process conditions.

1. Dielectric Constant

The dielectric constant is measured for samples of substrate whose dimensions are about 0.1"–0.1", composed of a layer of polymer sandwiched between two metal layers. The capacitance of the polymer layer is measured, and the dielectric constant is calculated from the result of this measurement. The error in the estimation of the area of the top metal layer is about 5%–10% of the average value. The measurement of capacitance is accurately measured, and the dielectric constant is calculated. The total possible error of the calculated value of the dielectric constant is about 10%–20% of the average value.

2. Film Composition

The composition of the films is characterized by Fourier Transform Infrared Spectroscopy (FTIR, Bio-Rad Systems, Inc.) using methods known in the art, and the methods will not be discussed further. The ratio ($\gamma$) of hydrocarbon CHx to SiO$_2$ is calculated by comparing the areas under the peaks at 3200 or 1250 cm$^{-1}$ with the area under the peak at 879 cm$^{-1}$.

D. Regulation of Physical and Chemical Properties of Polymer Films

1. Regulation of Process Conditions

The plasma variables used to control the physical and chemical nature of the deposited polymer film are excitation power in Watts (W), flow rate (F) of the monomer(s), molar rations of different monomers (for making co-polymers or gradient films), substrate temperature $T_s$, deposition pressure (P), substrate bias ($V_s$), and monomer temperature ($T_{mo}$), the flow rates of the feed gas and/or monomer(s), relative positions and separation of the anode and cathode plates, location of the gas inlet and pump outlet and control of the pump speed. All of these factors have effects on the types and properties of the deposited film. Other factors such as the reactor geometry can play a major role.

Among all plasma parameters, the flow rate and power level have the most profound effects on the properties of deposited products. For instance, under the same flow rate, increasing power levels resulted in thin films of higher dielectric constants, high glass transition temperatures and thermal resistance for a given composition of siloxane chemicals. On the another hand, under the same power level, increasing flow rates will result in lower dielectric constant and thermal stability of the products due to presence of large amounts of —CH$_x$—groups (X=1 to 3). This is because CH$_x$—containing polymers such as polyethylene (K=2.0) have lower dielectric constants than does SiO$_2$ (K=4.0).

All depositions can be performed after subjecting the surfaces to an in-situ argon plasma precleaning step. The films are deposited at RF power ranges of a few tens of Watts to a few hundred Watts with a gas flow rate of between 30–90 SCCM. The chamber pressure during deposition ranges from $10^{-3}$ Torr to a few Torr. Deposition rates vary from a few hundred Å/min to close to 0.4 $\mu$m/min.

The useful processing parameters therefore have to be optimized for each composition in order to obtain desirable combinations of dielectric constant, mechanical properties such as Elastic Modulus, thermal properties such as T$_g$ and residual stress and sufficient protection of metal/polymer interfaces from moisture. The following parameters were found useful for making low K dielectric materials with high thermal stability from siloxanes of this invention: Power levels range from 80 to 300 Watts, or preferably from 120 to 200 Watts under the gas flow rates range from 30 to 90 SCCM, preferably from 50 to 75 standard cubic centimeters per minute (SCCM) and a vacuum pressure of few milliTorr. Using these conditions, void free thin films with dielectric constants ranging from 2.2 to 2.6 can be obtained at deposition rates ranging from 1200 Å to 2000 Å/min. These films have Tgs in the range from 150° C. to 300° C. and have low residual stress ranging from 15 MPas to 50 MPas.

For a 4 inch diameter wafer and power levels below about 20 Watts, most of the hydrocarbons of the precursor introduced into the chamber are intact. However, as the power level increases to about 40 to 50 Watts, the hydrocarbon content decreases rapidly. Increasing the power level further above about 100 Watts decreases the hydrocarbon contents is greatly reduced for the gas flow rates studied. For larger wafers, the power should be increased proportionately.

Also, for 4 inch diameter wafers, for the precursor is {Si—(OCH$_3$)$_2$}$_4$, and when $\gamma$ (1250/870 cm$^{-1}$) decreases from 0.08 top 0.37, the dielectric constant of the resulting film increases from 2.0 to 3.5. Therefore, when the flow rates is 30 SCCM, K increases from 2.3 to 2.8 as the power level increases from 80 Watts to 250 Watts. At higher flow rates of 75 SCCM, K increase from 2.25 to 2.4 as the power level increases from 80 to 150 Watts. For larger wafers, the power should be increased proportionately.

Additionally, for 4 inch diameter wafers coated with the above films, Electron Spectroscopy for Chemical Analysis (ESCM) is also employed for more quantitative analysis of surface compositions of the deposited films. ESCI studies indicated for a flow rate of 30 SCCM, as the power level increased from,80 to 200 Watts, the number of carbon atoms per silicon atom in the polymer film surface was 1.36 and 1.17, respectively. Because the theoretical C/Si ration in a monomer is 2, this results indicates that in addition to the C—H bond dissociation, there is substantial Si—C bond dissociation during plasma polymerization. For larger wafers, the power should be increased proportionately.

2. Manufacture of Co-Polymers

Although materials with low dielectric constant (K=2.2 to 3.2) can be achieved by plasma or photon assisted polymerization of siloxanes, the resulting low dielectric films usually have poorer thermal stability due to presence of large proportion of $sp^3$ C—H and $sp^3$ Si—$sp^3$C bonds. To improve the thermal stability of the above films without compromising their dielectric properties, one can use admixtures of siloxanes and fluorinated aromatic compounds that disclosed in this invention. For example, admixtures of $CF_3$—$C_6F_4$—$CH_3$ and $\{Si—(OCH_3)_2\}_4$ can be used together. In general, under the conditions described above, the thermal stability and the dielectric constant of the polymer increases as the molar ratio of the $CF_3$—$C_6F_4$—$CH_3$ increases.

These co-polymer films are pinhole free, possess high mechanical strength and adhesion and can be deposited conformally onto any surfaces. The plasma variables can be so adjusted so as to yield a film with relatively low residual stress. Thin firms on silicon with residual stress as low as 5 to 30 MPa at room temperature can be achieved for film thicknesses up to a about 5 $\mu$m. The coefficient of thermal expansion perpendicular to the film (Z-CTE) of this film was estimated to be about 10 to 25 ppm/° C. One of the drawbacks of plasma polymerization for hydrocarbons in the past has been the low deposition rates. However, with the presence of siloxanes, we have been able to achieve deposition rates close to 0.2 $\mu$/min routinely and can achieve deposition rates of up to 0.4 $\mu$m/min.

Using admixtures of precursors at low precursor flow rates and low power levels, there is a sharper increase in the dielectric constant than for higher flow rates at higher power levels. Increasing the flow rate does not further increase dielectric constant, rather, the dielectric constant levels off. The former can be classified as a "power rich" region, and the latter, a "power deficient" region. This result is consistent with the increases in C—H bond dissociation , which results in increased ratio of SiO2 to CHx (where X=1 to 3) contents, as derived from FTIR and ESCA studies described above.

3. Manufacture of Gradient Polymer Films

Figure 10:
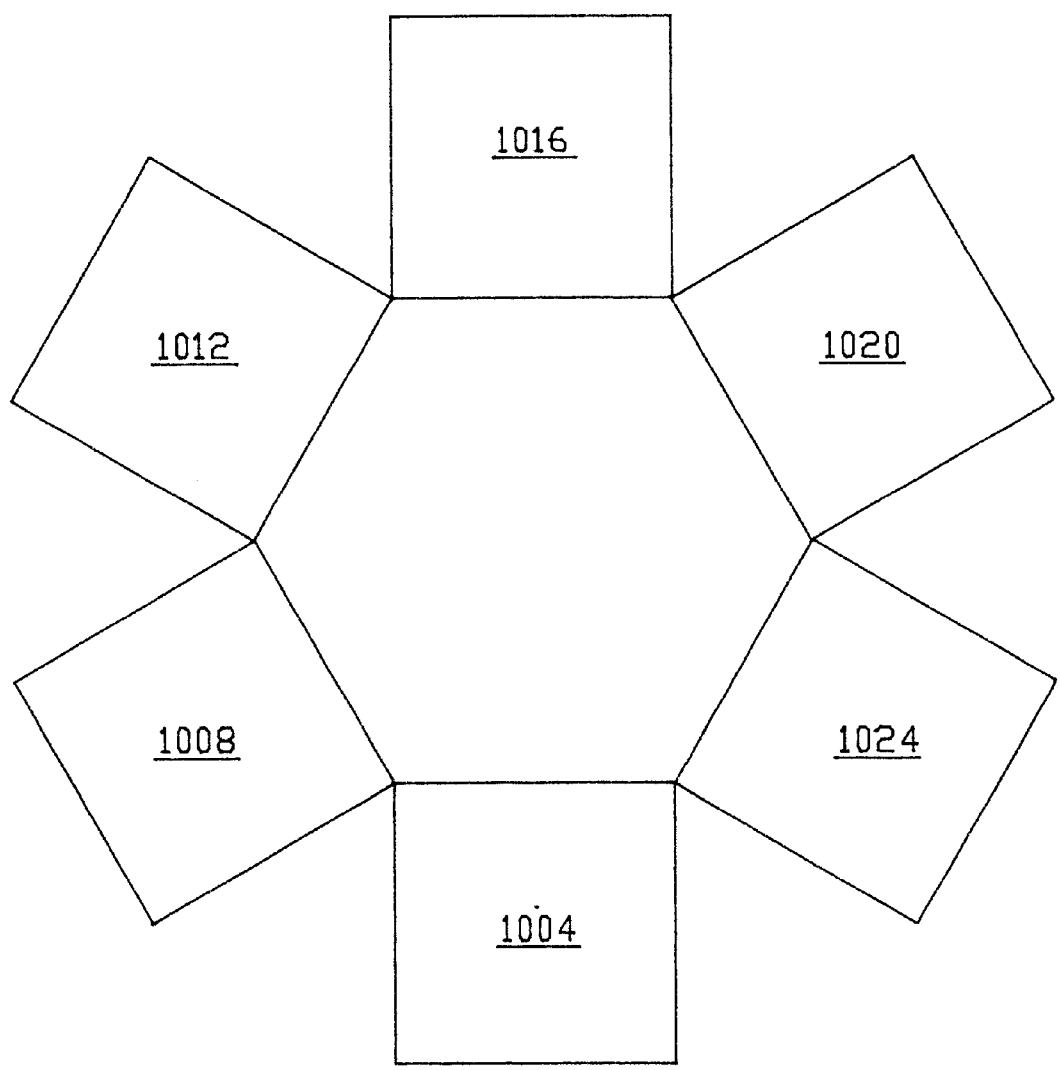
FIG. 10 is a depiction of a cluster tool which can be used to deposit step-gradient films of this invention.

Step-gradient films of this invention can be manufactured by depositing a first layer of material which contains siloxanes which will adhere to the substrate. This tightly adhering layer functions as an adhesive layer, permitting subsequent layers to adhere to the semiconductor device. On top of this siloxane-rich layer, an additional layer, containing for example, a fluorinated aromatic hydrocarbon can be deposited using either the same deposition chamber, or by using the cluster tool described below (FIG. 10).

In another option of this invention, continuous gradient thin films are made by gradually introducing different precursors or combinations of precursors into the apparatus during the plasma deposition process. For instance, first, a siloxane-rich thin layer ranging from a few tens of Å to several hundreds of Å is deposited onto a metal layer. Then, on top of this siloxane-rich layer, a layer of $sp^2C$—F bond-rich siloxanes or organic compounds is made by introduced into the deposition apparatus with increasing molar % of fluorinated aromatic compounds toward the centers between the metal lines and away from the metal surfaces. The layer making contact with the metal can be composed of a material with a lower dielectric constant (K<2.0 to 2.6). This type of polymer is desirable if the polymer can withstand the temperatures of the processes, or if a higher K (2.6 to 3.2) is suitable. If the temperatures of the subsequent processing steps are unsatisfactorily high for siloxanes, materials with higher thermal stability will be required. These materials also have higher dielectric constants. The siloxane-rich layer is well suited as a water barrier which can seal the metal lines (the "hermetic effect" ) preventing their corrosion. This is especially important when copper is used as the metal.

On the other hand, by increasing the molar % of $sp^2C$—F bonds in the polymer away from the metal features, materials with lower dielectric constants and increased thermal stability are desirable. The gradient polymer scheme increases the effective insulation properties, while achieving better interfacial protection of metal features.

In another option of this invention, on top of the interlevel dielectric layer, a $SiO_2$-rich layer can be deposited. This can be simply achieved by increasing the power level of the plasma to over 300 Watts for a 4 inch diameter wafer ans using admixtures with higher percentages of siloxane precursors. The $SiO_2$-rich cover layer is helpful for CMP of these materials and metals following deposition.

Figure 6:
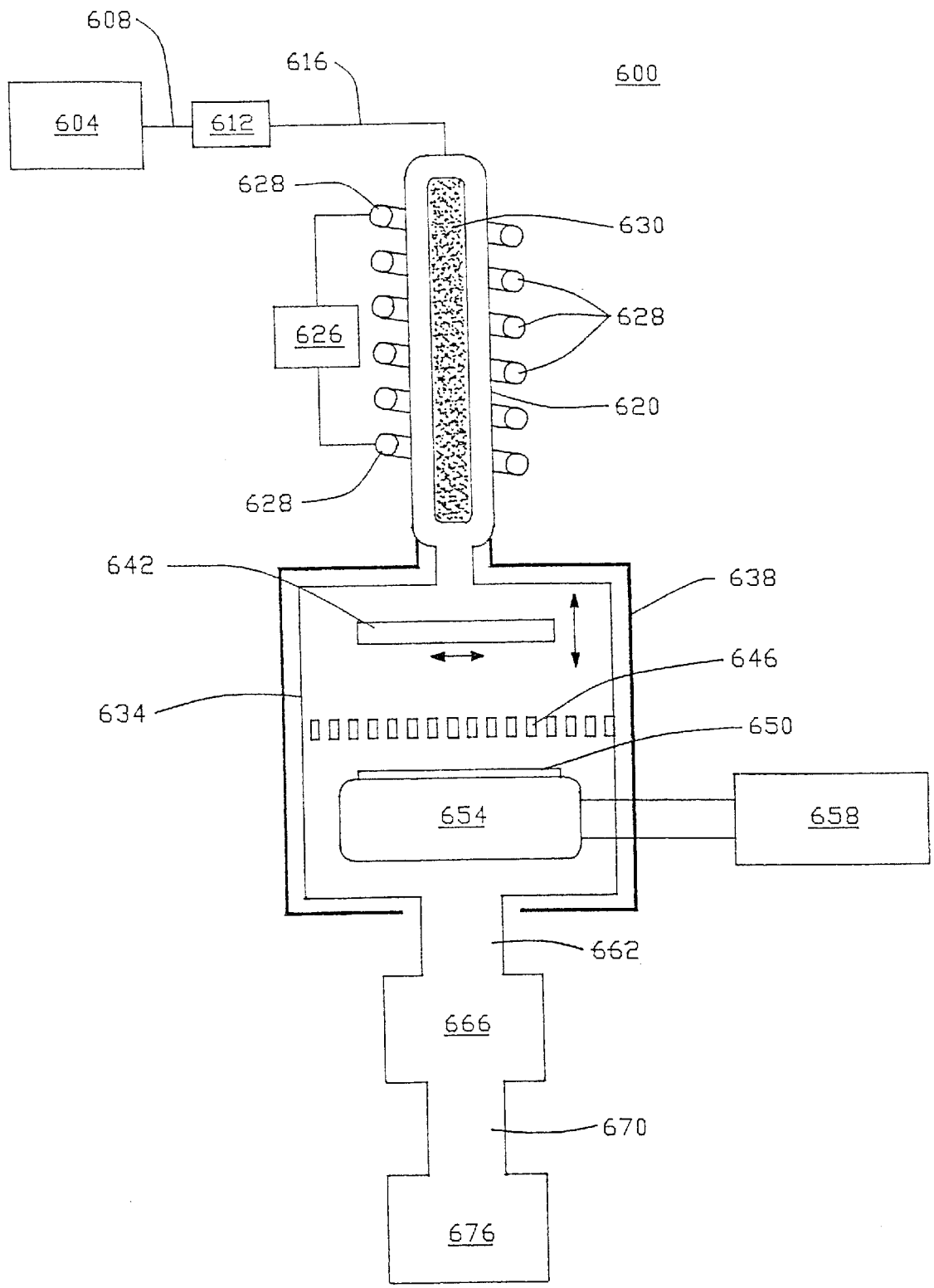
FIG. 6 is a schematic diagram of a transport polymerization system employing radio frequencies to generate a plasma.

E. Equipment Used to Generate Plasmas for Transport Polymerization and Chemical Vapor Deposition 1. Plasma Enhanced Transport Polymerization Using a Radio Frequency Plasma Generator FIG. 6 is a schematic diagram of a transport polymerization system 600 employing RF to generate a plasma. The precursors are stored in a precursor holder 604, are transported via a pipe 608 and through a liquid injector for liquid precursors, or a mass flow controller 612 for gasses, then are transported via another pipe 616 into a plasma tube 620 made of quartz. Preferably, the tube 616 is made of a single quartz crystal. Precursors are exposed to RF energy generated by a RF generator 626, through a coil 628, and a plasma 630 is thereby generated. The plasma 630 then flows into a deposition chamber 634 which is surrounded by a heater 638. The heater 638 keeps the walls of the chamber 634 above the condensation temperature of the reactive intermediates. This prevents condensation of intermediates onto the walls of the chamber 634. The flow of intermediates is adjusted by a flow pattern adjuster 642. Vertical movement of the flow pattern adjuster 642 adjusts the flow rate of intermediates into the chamber 634, and aids in mixing the intermediates in the chamber 634. Horizontal movement of the flow pattern adjuster 642 adjusts the distribution of the intermediates over the surface of wafer 650. A gas dispersion plate 646 with holes distributes the flow of intermediates evenly over the surface of the wafer 650.

The wafer 650 is held on a cold chuck 654, which is kept cool by a chiller 658 employing any conventional cooling method, including liquid nitrogen and reverse Peltier effect. The chamber is connected via a pipe 662 to a cold trap 666, which traps undeposited intermediates. The pressure in the chamber 634 is maintained by a pump 676 connected to trap 656 by a pipe 670.

Frequencies needed to generate plasmas are in a range of from 1 kHz to 2.5 GHz. A preferred range is between 400 kHz and 13.56 MHz, with the most preferred frequency being 13.56 MHz. The power should be in the range of 30 to 300 Watts. Preferred power range is 100 Watts to 250 Watts, and the most preferred power is 200 Watts of discharge power. The pressure should be kept within a range of from 0.001 Torr to 100 Torr, preferably from 50 milliTorr to 500 milliTorr, and most preferably at 100 milliTorr pressure. Alternatively, using low frequencies (5 kHz) can result in formation of insoluble poly(para-xylylene) which have higher temperature resistance. Morita et al. *Trans. IEEE Japan* pp: 65075 (1972). A carrier gas such as nitrogen or argon is used, and the flow rates of the carrier gas should be from 30 to 90 SCCM, preferably from 50 to 75 SCCM.

Figure 7:
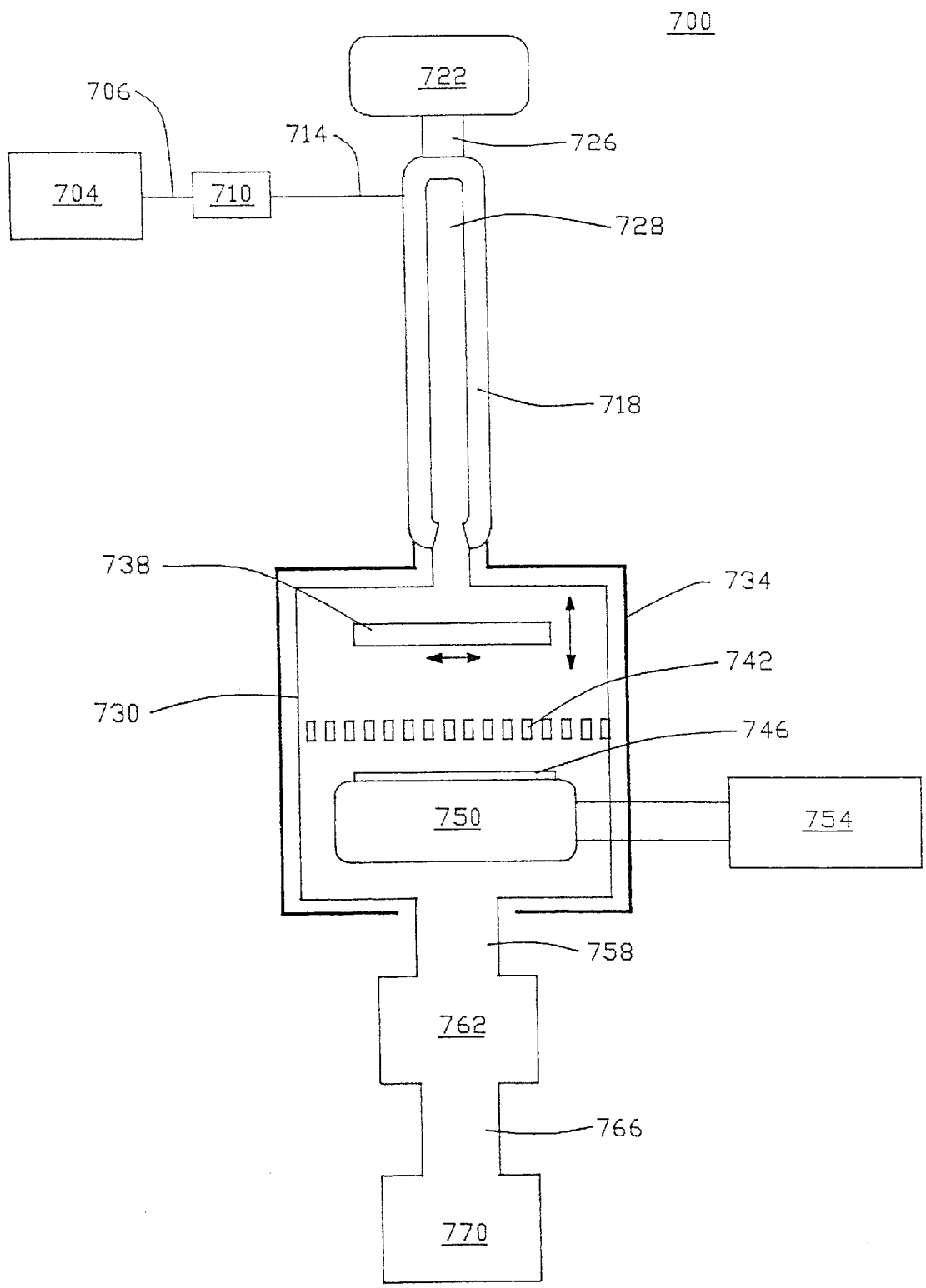
FIG. 7 is a schematic diagram of a transport polymerization system employing microwaves to generate a plasma.
Figure 8:
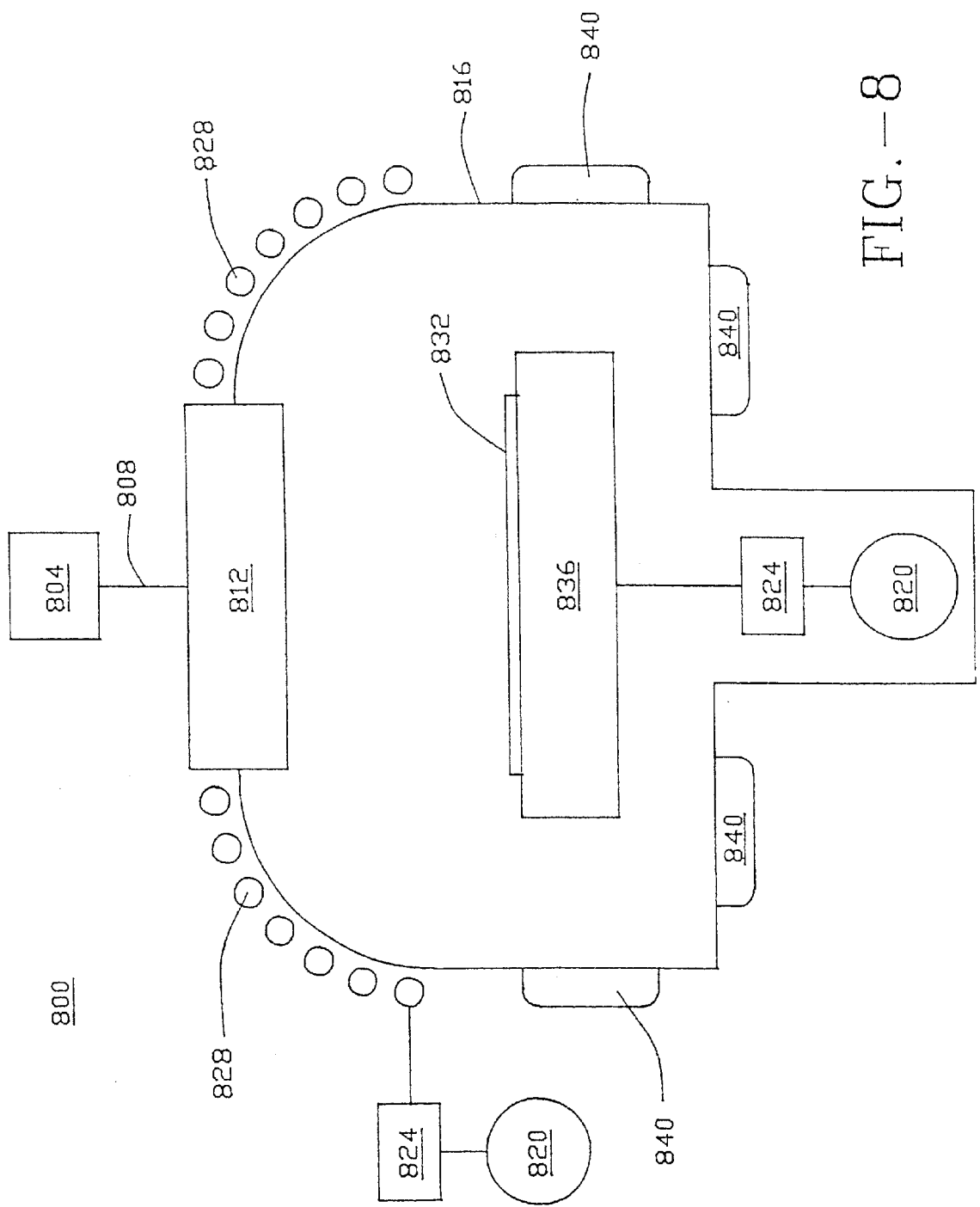
FIG. 8 is a depiction of an inductively coupled high density plasma apparatus.

2. Plasma Enhanced Transport Polymerization of Polymers Using a Microwave Generator Microwave sources can also be used to generate plasmas for generating the reactive intermediates. FIG. 7 is a schematic diagram of a transport polymerization system employing microwaves. Precursors are held in a precursor tank 704, and are vaporized, pass through a pipe 706 and through a mass flow controller 710, through a second pipe 714 and into a quartz tube 718. A microwave generator 722 is attached via a waveguide 726 to one end of the quartz tube 718. Microwave energy enters the quartz tube 718 where a plasma 728 is generated, which dissociates the precursors into reactive intermediates. After dissociation, the intermediates are transported into a chamber 730 heated by a heating device 734, including, but not limited to resistive heater. The flow of the intermediates is controlled by a flow pattern adjustor 738. Vertical movement of the a flow pattern adjustor 738 adjusts the flow rate of intermediates into chamber 630 and adjusts the mixing of intermediates in chamber 730. A gas dispersion plate 742 evenly distributes the intermediates over the surface of wafer 746. The intermediates deposit on the wafer 746, which is held by a cold chuck 750, which is attached to a chiller 754 employing any conventional cooling means, including, but not limited to liquid nitrogen or reverse Peltier effect. The chamber pressure is controlled by a pump 770, connected via a pipe 766 to a cold trap 762. The trap 762 is connected via a pipe 758 to the chamber 730. The cold trap 762 protects the pump 770 from deposition of intermediates.

Microwave power density or electron field strength is selected based upon the residence time of the precursors in the chamber. The power is generally between 200 and 700 Watts, preferably between 400 and 600 Watts, and most preferably at 500 Watts. Desirable electron energy is chosen to match the bond energy of the leaving group.

To prevent condensation of precursor, intermediates, or products on the chamber walls, the pressure within the reaction vessel should be below atmospheric pressure. Pressures in the range of 0.001 to 200 Torr work well. Furthermore, to inhibit condensation of chemicals, the walls of the reaction chamber should be kept warm, preferably in the range of 50° C. to 150° C., preferably above 100° C. The IR radiation heats the precursors to a threshold temperature, requiring less VWV power to complete the cracking reaction. IR also heats the chamber walls to decrease deposition on them because VUV is a cold light source which does not heat up the chamber.

Deposition and polymerization of reactive intermediates to form low dielectric polymers is achieved by placing the wafer on a cold chuck. The temperature of the cold chuck should be between −198° C. and 30° C., preferably at about −5° C. Any suitable method for cooling the cold chuck may be used, including reverse Peltier, liquid nitrogen, or conventional refrigeration methods. Reverse Peltier and liquid nitrogen cooling methods are preferred. To prevent condensation of chemicals on the pump, a cold trap is placed between the vacuum pump and the deposition chamber.

3. High Density Plasma Chemical Vapor Deposition

A high density plasma deposition process can also be used to dissociate precursors. In contrast to the low density plasma process described above, in high density plasmas, the electron density is in the range of from about $10^{13}$ to $10^{14}$ electrons/$cm^3$. This process must be carried at lower pressures than conventional plasma processes. In this embodiment, a inductively coupled high density plasma apparatus 800 is shown schematically in FIG. 8. A precursor delivery system 804 volatilizes or vaporizes the precursor, which flows through a pipe 808 and an anode gas injector 812 into the deposition chamber 816. The anode gas injector 812 is attached to RF generators 820 which are matched by matching controllers 824. The output of the RF generators 820 passes through inductive coils 828 to produce an electrical field. The wafer 832 is held by a cathode electrostatic chuck 836, which is connected to the RF generator 820. IR sources 840 provide additional heating of precursors to decrease the needed plasma power and to inhibit condensation on the chamber walls. The plasma source power needed for a wafer of 8 inch diameter is in the range of about 100 Watts to 4000 Watts, and preferably about 2000 Watts. For wafers of other sizes, power should be adjusted accordingly. Power is in the range of about 1 Watt/$cm^2$ of wafer surface area to about 15 Watts/$cm^2$, preferably from about 2 Watts/$cm^2$ to about 10 Watts/$cm^2$, and more preferably about 5 Watts/$cm^2$. The chamber pressure is maintained in the range of 0.01 milliTorr to 10 milliTorr, and preferably below 5 milliTorr by a pump and cold trap (not shown). The wafer temperature is in the range from about 300° C. to 450° C., and is preferably about 350° C.

4. Combined Transport Polymerization and CVD Apparatus Utilizing Combined Photon and Plasma Processes To improve deposition rate, a novel chamber design comprising utilization of magnets on the periphery of the chamber wall is used in this invention. The magnetic multipole configuration confines the plasma and increases the lifetime of primary electrons, therefore enabling the generation and sustenance of a low pressure plasma. This allows the deposition to occur at lower pressure and higher flow rates and overcomes the problem of powder formation during high deposition rates. The upper electrode, attached to the copper electrode is connected to the RF power through a matching network, and the lower electrode is connected to the ground. A ring of magnets is used to confine the plasma. These magnets are attached to the outer wall of the deposition chamber. The advantages of locating the magnets outside the chamber are that the powder cannot form on the magnets themselves, and such a reactor has a simpler design.

Figure 9:
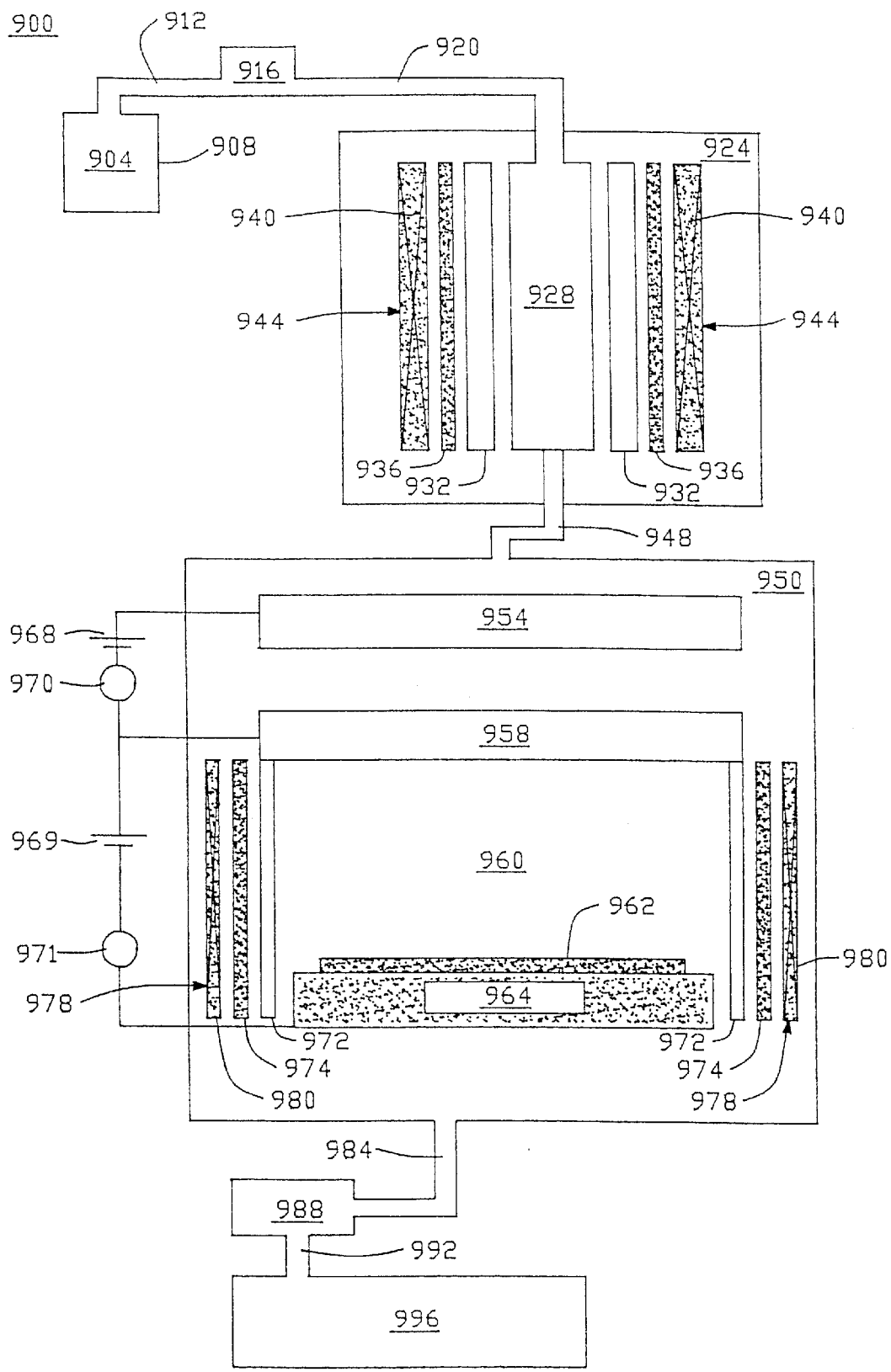
FIG. 9 depicts a schematic diagram of a combination transport polymerization and chemical vapor deposition reactor utilizing photon-plasma and infrared radiation.

FIG. 9 depicts a schematic diagram of a TP and CVD reactor 900 embodying the elements for photon-plasma and IR dissociation and deposition. Precursors 904 are stored in a precursor container 908 which is connected via a pipe 912 to a mass flow controller 916. For TP, precursors are transported into a dissociation reactor 924 which houses the dissociation chamber 928. The wall of reactor 924 is made of crystalline materials such as LiF, $MgF_2$, or $CaF_2$, which permits light of vacuum ultraviolet wavelengths to pass. Vacuum ultraviolet and ultraviolet light is generated by a silent discharge plasma generators 932, which are place inside infrared heaters 936. The infrared heaters 936 are placed inside DC magnets 940 and AC magnets 944. The magnets regulate the flow of plasma during dissociation, and the reactive intermediates so generated are transported to a deposition reactor 950.

The deposition reactor 950 contains a deposition chamber 960 containing a gas and reactant dispersion manifold 954, a gas and reactant dispersion plate 958. The walls of the deposition chamber are made of crystalline materials such as LiF, $MgF_2$, or $CaF_2$, which permits light of vacuum ultraviolet wavelengths to pass. The gas dispersion manifold 954 and the gas dispersion plate 958, are used to adjust the distribution and homogeneity of the intermediates. The intermediates are directed toward the wafer 962, which is held on a cold chuck 964. The gas dispersion manifold 954 and dispersion plate 958 are connected in parallel to a DC voltage bias anode 968, a DC voltage bias cathode 969, an AC voltage bias anode 970, and an AC voltage bias cathode 971. Silent discharge plasma generators 972 are placed outside the deposition chamber 960. Infrared heaters 974 are placed outside the silent plasma discharge generators 960 and DC magnets 978 and AC magnets 980 are placed outside the infrared heaters 974. Gasses exit the deposition chamber 960 through a pipe 984, pass through a cold or reactive trap 988, pass through another pipe 992 to a vacuum pump 996. The pressure in the systems is maintained at a desired pressure using pump 996. The trap 988 protects the pump from deposition of intermediates.

For CVD, the deposition chamber can be used without the dissociation reactor. Precursors are placed directly on wafer 962, and the chuck 964 is not cooled. IR, UV, or VUV radiation is directed toward the wafer 962. The radiation dissociates the precursor, and deposition of intermediates and polymerization takes place on the wafer.

Table 4 shows process conditions for combined photon-plasma assisted precursor dissociation using chamber 923, and Table 5 shows process conditions for combined photon-plasma precursor deposition in deposition chamber 960.

TABLE 4

Process Conditions for Photon-Plasma Precursor Dissociation

| Variable | Range | Preferred Range |
|---|---|---|
| Temperature | 200° C.–600° C. | 350° C.–500° C. |
| Photon Wavelength | 100 nm–400 nm | 140 nm–300 nm |
| Photon Energy | 2.5 eV–12 eV | 4 eV–9 eV |
| Photon Flux | 10 milliW/cm$^2$–5 W/cm$^2$ | 40–100 milliW/cm$^2$ |
| Plasma Density | $10^{12}$–$10^{14}$ electrons/cm$^3$ | $10^{13}$ electrons/cm$^3$ |
| Pressure | 0.1 milliTorr–10 Torr | 1 milliTorr–100 milliTorr |

TABLE 5

Process Conditions for Photon-Plasma Precursor Deposition

| Variable | Range | Preferred Range |
|---|---|---|
| Temperature | –20° C.–300° C. | –10° C. |
| Photon Wavelength | 100 nm–400 nm | 250 nm |
| Photon Energy | 2.5 eV–12 eV | 4.5 eV |
| Photon Flux | 10 milliW/cm$^2$–5 W/cm$^2$ | 10–100 milliW/cm$^2$ |
| Plasma Density | $10^{12}$–$10^{14}$ electrons/cm$^3$ | $10^{13}$ electrons/cm$^3$ |
| Pressure | 0.1 milliTorr–10 Torr | 1 milliTorr–100 milliTorr |

TABLE 6

Process Conditioned for Chemical Vapor Deposition

| Variable | Range | Preferred Range |
|---|---|---|
| DC Bias Voltage | 100–2000 V | 500 V |
| AC Bias Voltage | 10–200 V | 50 V |
| Pulsed Bias Voltage | 100–4000 V | 500 V |
| Pulse Width | 10–1000 msec | 1 msec |
| Pulse Frequency | 10 Hz–1000 Hz | 60 Hz |
| DC Magnetic Field Strength | 100–2000 Gauss | 700 Gauss |
| AC Magnetic Field Strength | 100–1000 Gauss | 500 Gauss |
| AC frequency | 10 Hz–500 Hz | 50 Hz–60 Hz |
| Pressure in Silent Discharge Generator | 100 Torr–1500 Torr | 760 Torr |
| AC Power to Silent Discharge Generator | 100 Watts–2000 Watts | 500 Watts |

The plasma density is reported as electron density, but it is to be noted that ion density must be the same to maintain charge neutrality of the plasma. Any non-uniformity of charge distribution can result in plasma damage to the thin film of low dielectric material, as well as imparting charge to the integrated circuit components.

Control of the plasma is by a magnetic field within the precursor chamber and in the deposition chamber. In the precursor reactor, the plasma is confined to any desired area, such as the center of the reactor. Additionally, alternating the polarity of the magnetic field stirs the plasma, ensuring even energy distribution within the plasma, thereby increasing the efficiency of dissociation of precursor molecules into reactive intermediates. In the deposition chamber, the magnetic field is used to control the pattern of distribution of intermediates over the wafer. This would serve two purposes: (1) to direct the deposition of precursor to the desired portion of the surface, thus conserving the precursor, and (2) minimize film deposition on other parts of the reactor chamber, thus minimizing the required cleaning, minimizing particle generation, and simplifying the reactor chamber design.

Another feature comprises the placement of an electrical bias voltage within the deposition chamber. This provides a further means of controlling the flow of plasma-ionized species to the site of deposition on the wafer. A bias voltage, in the form of direct current (DC) or alternating current (AC) can be applied and modulated. Pulsed voltages can be used to alter the flow pattern of ions to either accelerate, decelerate, or to regulate the density of the plasma ions in the stream reaching the wafer. Optimization of ion velocity and flow, thus can be obtained using various combinations of magnetic field and bias voltage. Table 6 shows the ranges of the various magnetic field and bias voltage variables which are regulated in this invention.

TABLE 7

Optimization of Electrical and Magnetic Field Variables for Association

| Variable | Range | Preferred Range |
|---|---|---|
| Pressure in Silent Discharge Generator | 100 Torr–1500 Torr | 500 Torr |
| AC Power to Silent Discharge Generator | 100 Watts–2000 Watts | 500 Watts |
| AC Magnetic Field Strength | 100 Gauss–1000 Gauss | 500 Gauss |
| DC Magnetic Field Strength | 100 Gauss–2000 Gauss | 700 Gauss |

TABLE 8

Optimization of Electrical and Magnetic Field Variables for Deposition

| Variable | Range | Preferred Range |
| --- | --- | --- |
| DC Bias Voltage | 100–2000 V | 500 V |
| AC Bias Voltage | 10–200 V | 50 V |
| Pulsed Bias Voltage | 100–4000 V | 500 V |
| Pulse Width | 10–1000 msec | 1 msec |
| Pulse Frequency | 10 Hz–1000 Hz | 60 Hz |
| DC Magnetic Field Strength | 100–2000 Gauss | 700 Gauss |
| AC Magnetic Field Strength | 100–1000 Gauss | 500 Gauss |
| AC frequency | 10 Hz–500 Hz | 50 Hz–60 Hz |

For transport polymerization of precursors containing —H as a leaving group, the inclusion of a "hydrogen membrane" may be desired. When the precursors flow through the cracking apparatus, —H is cleaved from the reactive groups of the precursors, and this —H can dimerize to form molecular hydrogen. To prevent this hydrogen from adsorbing onto the wafer surface, a membrane with pores of about 3 Å to about 5 Å in diameter. Because the size of molecular hydrogen is small enough to penetrate the membrane but the radical intermediates are not small enough, the hydrogen can be effectively removed from the cracking chamber and thereby avoid contaminating the polymer. For other leaving groups, similar membranes with appropriate sized pores can also be used.

D. Cluster Tool For Multiple Depositions on Wafers

Several of the above processes can be carried out using a single piece of equipment. FIG. 10 shows a schematic diagram of a cluster tool 1000. A first station 1004 is a wafer cassette which holds one or more wafers for processing. A wafer is transported to a cleaning chamber 1008 where the wafer is exposed to VUV light of wavelengths in the range of from about 180 nm to about 450 nm, or to UV light. This pre-treatment is to remove impurities from the wafer surface prior to deposition of material with low dielectric constant. After cleaning, the wafer is transported to a first processing station 1012, where a first deposition occurs. The processing station 1012 can be any of the devices depicted in FIGS. 4–9 above. After a first processing step at station 1012, the wafer is transported to a second processing station 1016, where further deposition of low dielectric material occurs. Subsequently, the wafer is transported to a third processing station 1020, where a third layer of low dielectric material is deposited. It is desirable to deposit several layers of low dielectric material in different processing stations because there are likely to be variations in the flow patterns in the different stations. After the deposition steps have been completed, the wafer is transported to a fourth processing station 1024, where a fourth layer of low dielectric material is deposited. Differences in flow patterns may result in the uneven deposition of films in each station. It is unlikely that the uneven deposition pattern for each station will be the same. Therefore, by depositing multiple layers of polymer, any differences in. thickness of precursor resulting from deposition in one station can be at least partially corrected by polymer deposition in another station.

A step-gradient film can be made by depositing a siloxane-rich precursor mixture at station 1012, and a second mixture, containing, for example, a mixture rich in fluorinated aromatic precursors at station 1016. Subsequent additional layers with different compositions may be deposited at subsequent stations.

Alternatively, the station 1024 can be used for post-deposition treatments, such as thermal annealing, reflow, plasma surface treatments, or cross-linking by exposing the polymer film to VUV of wavelengths in the range from 180 nm to 450 nm.

Another advantage of the cluster tool is the possibility of depositing different types of polymers at the different stations. Thus, it is possible to deposit a first layer chosen to adhere tightly to the substrate, a second layer chosen to have certain dielectric properties, thermal stability, or mechanical stability. A third layer may be chosen the have the same or different properties.

E. Gradient Thin Films Of Siloxanes and Fluorinated Hydrocarbons

Figure 11A:
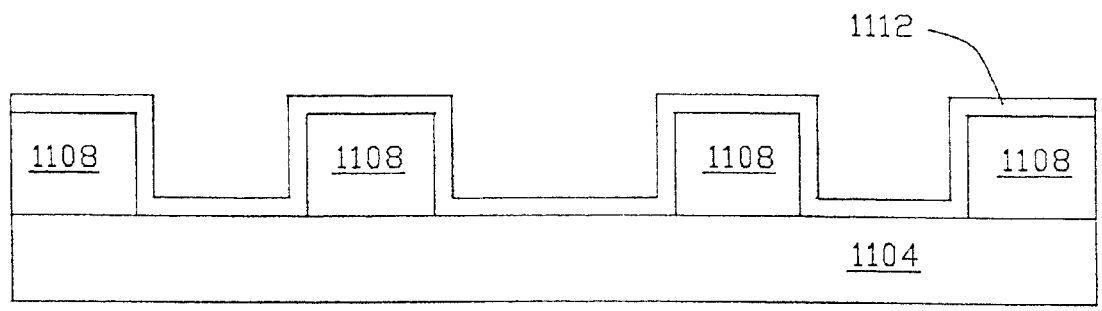
FIG. 11 is a schematic diagram of a step-gradient film of the present invention.
Figure 11B:
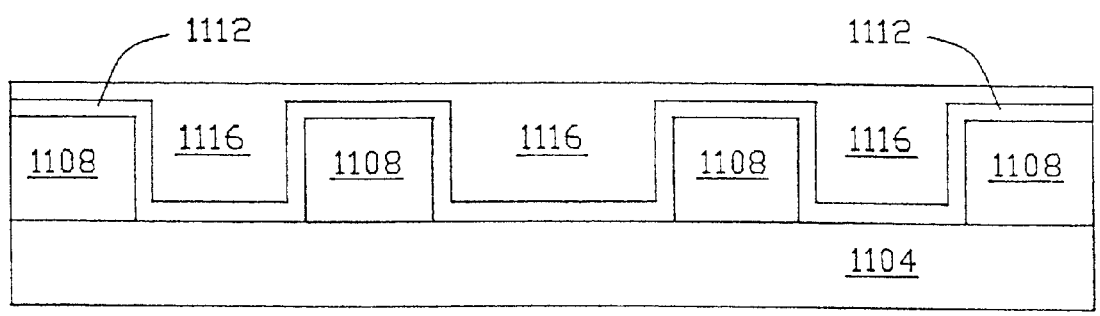

FIG. 11 shows a schematic diagram of the manufacture of a step-gradient film 1100 of this invention. Substrate 1104 has a series of metal lines 1108 deposited on its surface. FIG. 11*a* shows a layer of siloxane-rich polymer 1112 deposited on top of the metal lines and on the exposed substrate 1104. FIG. 11*b* shows a second layer of polymer, containing for example, a fluorinated aromatic hydrocarbon 1116. The surface of layer 1116 as shown has been planarized, but planarization need not be carried out, depending on the application. On top of this layer, another, siloxane-rich layer 1120 is deposited to permit the deposition of additional metal lines. This process can be carried out many times, resulting in the manufacture of a multi-layered semiconductor device.

Figure 12A:
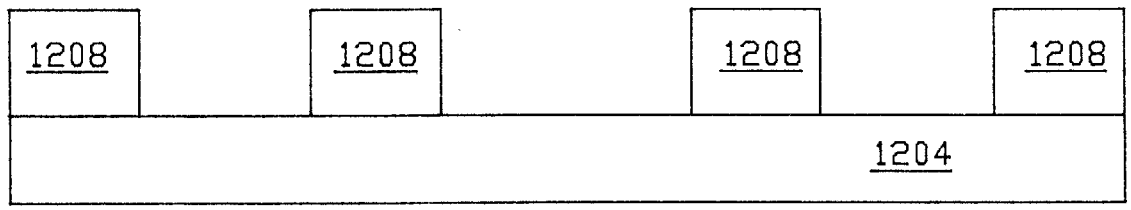
FIG. 12 is a schematic diagram of a continuous gradient film of the present invention.
Figure 12B:
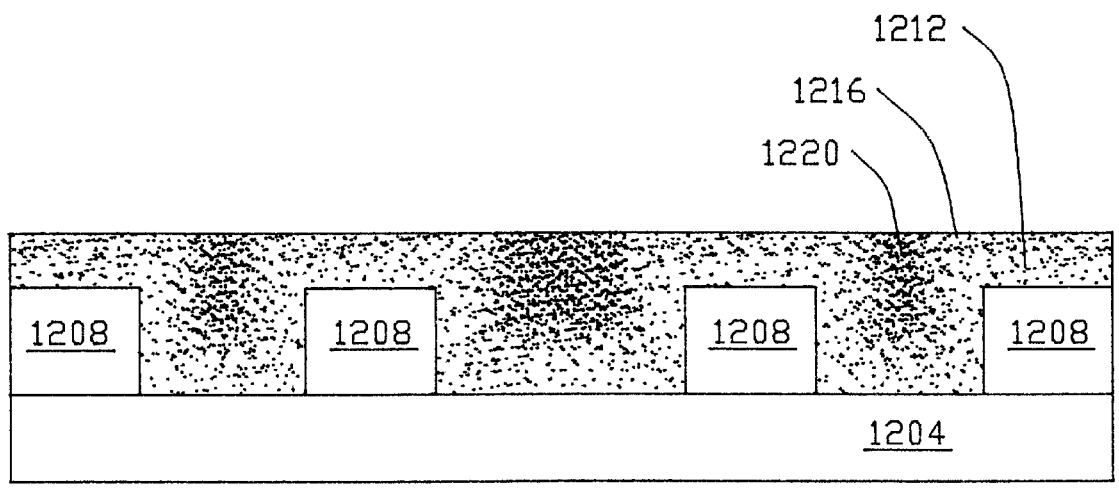

FIG. 12 shows a schematic diagram of the manufacture of a continuous gradient film 1200 of this invention. Substrate 1204 has a series of metal lines deposited on its surface. FIG. 12*a* shows the portion of the continuous gradient containing a siloxane-rich layer containing the least amount of fluorinated aromatic hydrocarbon (light shading) 1212, and the intermediate portion of the polymer film containing an intermediate concentration of fluorinate aromatic hydrocarbon 1216. Further from the metal lines, and further from the substrate 1204, the relative concentration of fluorinated aromatic hydrocarbon-containing polymer increases relative to the concentration of the siloxane-rich portion, making a portion of the gradient film which has a high concentration of fluorinated aromatic hydrocarbon 1220. The surface of the polymer layer 1220 is shown after planarization, but planarization need not be carried out, depending on the application. On top of this layer, another, siloxane-rich layer 1224 is deposited to permit the deposition of additional metal lines. This process can be carried out many times, resulting in the manufacture of a multi-layered semiconductor device.

EXAMPLES

Example 1

Deposition of Siloxane Polymer Film

The parallel plate plasma system with magnetic confinement was used for polymerization of $\{Si-(OCH_3)_2\}_4$ on a 4 inch diameter wafer. The power level was set at 80 Watts, the precursor flow rate was set at 75 SCCM, the deposition time was 20 minutes, and the deposition rate was 0.08 $\mu$/min. The film had a K of 2.32, Tg was 240° C., and the residual stress on silicon substrate was 37 MPa.

Example 2

Deposition of Siloxane Hydrocarbon Polymer Film

The plasma system described in Example 1 above was used for polymerization of an admixture of 60 molar % of $\{Si-(OCH_3)_2\}_4$ and 40 molar % of $CF_3-C_6H_4-CF_3$. The power level was set at 200 Watts, the precursor flow rate was set at 90 SCCM, the deposition time was 20 minutes, the deposition rate was 0.12 μm/min. The film had a K of 2.21, a Tg of 310° C., and a residual stress on a silicon substrate of 40 MPa.

Example 3

Co-Polymerization of a Siloxane Hydrocarbon Polymer Film

The plasma system described in Example 1 above was used for polymerization of an admixture of 40 molar % of {Si—(OCH$_3$)$_2$}$_4$ and 60 molar % of CF$_3$—C$_6$H$_4$—CF$_3$. The power level was set at 200 Watts, the precursor flow rate was set at 90 SCCM, the deposition time was 20 minutes, the deposition rate was 0.12 μm/min. The film had a K of 2.21, a Tg of 310° C., and a residual stress on a silicon substrate of 32 MPa.

The foregoing descriptions and Examples are included for illustrative purposes only, and are not intended to limit the scope of the invention. Other features, aspects and objects of the invention can be obtained from a review of the figures and the claims. It is to be understood that other embodiments of the invention can be developed and fall within the spirit and scope of the invention and claims.

Incorporation of Reference

Each of the references cited above in this application is herein incorporated fully by reference.

INDUSTRIAL APPLICABILITY

This invention includes novel precursors and methods for making sealants with low dielectric constant, high thermal stability, and high mechanical strength. The polymers include fluorinated aromatic moieties and can be used to manufacture thin films and integrated circuits.

Other features, aspects and objects of the invention can be obtained from a review of the figures and the claims.

What is claimed is:

1. A polymer film comprising the structure:

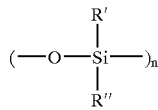

wherein at least one of R' and R" is a fluorinated aromatic group and the other of R' and R" is independently selected from the group consisting of fluorinated alkyl groups; aromatic groups and fluorinated aromatic groups, wherein n is an integer, said polymer film made from a cyclic precursor.

2. The film of claim 1, wherein R' and R" are fluorinated aromatic groups.

3. The film of claim 1, wherein said film is polymerized using a transport polymerization process or a chemical vaporization process.

4. The film of claim 3, wherein the transport polymerization process is selected from the group consisting of plasma enhanced transport polymerization and photon assisted transport polymerization.

5. The film of claim 4, wherein the photon assisted process utilizes electromagnetic radiation of at least one of infrared, ultraviolet and vacuum ultraviolet wavelengths.

6. The film of claim 5, wherein the vacuum ultraviolet light is generated using incoherent excimer radiation.

7. The film of claim 4, wherein the plasma is generated using one of a radio frequency generator and a microwave generator.

8. The film of claim 7, wherein the plasma is generated using radio frequencies in the range of from about 1 kHz and about 2.5 GHz.

9. The film of claim 8, wherein the plasma is generated using radio frequencies in the range of from about 400 kHz to about 14 MHz.

10. The film of claim 8, wherein the plasma is generated using radio frequencies of about 13.56 MHz.

11. The film of claim 8, wherein the plasma source power is in the range of about 100 Watts to about 4000 Watts and the chamber pressure is in the range of about 0.01 milliTorr and about 10 milliTorr.

12. The film of claim 8, wherein the plasma source power is in the range of about 1 Watt/cm$^2$ to about 15 Watt/cm$^2$.

13. The film of claim 8, wherein the plasma is generated using a microwave generator.

14. The film of claim 13, wherein the microwave power is between about 200 Watts and about 700 Watts.

15. The film of claim 13, wherein the microwave power is between about 400 Watts and about 600 Watts.

16. The film of claim 13, wherein the microwave power is about 500 Watts.

17. The film of claim 8, wherein the plasma source power is about 5 Watt/cm$^2$.

18. A semiconductor device, comprising:

a substrate and a barrier layer comprising a polymer film comprising the structure:

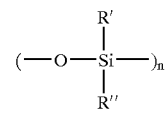

wherein at least one of R' and R" is a fluorinated aromatic group and the other of R' and R" is independently selected from the group consisting of fluorinated alkyl groups; aromatic groups and fluorinated aromatic groups, wherein n is an integer, said polymer film made from a cyclic precursor.

19. The semiconductor device of claim 18, further comprising a metal layer on said substrate and having said barrier layer on said metal layer.

20. A semiconductor device, comprising:

a substrate;

a dielectric layer and an adhesion layer comprising a polymer film comprising the structure:

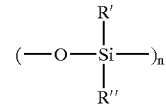

wherein at least one of R' and R" is a fluorinated aromatic group and the other of R' and R" is independently selected from the group consisting of fluorinated alkyl groups; aromatic groups and fluorinated aromatic groups, wherein n is an integer, said polymer film made from a cyclic precursor.

21. A polymer film comprising the structure:

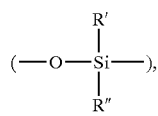

wherein at least one of R' and R" is a fluorinated aromatic group and the other of the R' and R" groups is independently selected from the group consisting of —H, —CH$_3$,
—CF$_3$, —(CH$_2$)$_n$—CF$_3$,
—C$_2$H$_5$,
—C$_6$H$_5$,
—C$_6$(CF$_3$)H$_4$,
—C$_6$F$_n$H$_{(5-n)}$, wherein n is an integer of from 0 to 5,
—CF$_2$—C$_6$F$_5$,
—CF$_2$—C$_6$F$_4$—CF$_3$,
—CF$_2$—C$_6$F$_4$—C$_6$F$_5$,
—CF$_2$—C$_6$F$_4$—C$_6$F$_4$—CF$_3$,
—C$_{10}$F$_8$,
—CF$_2$—C$_6$H$_4$—CF$_3$,
—C$_{10}$H$_{(6-n)}$F$_n$—, wherein n is an integer ranging from 0 to 6,
—C$_{12}$H$_{(8-n)}$F$_n$—, wherein n is an integer ranging from 0 to 8,
—C$_{13}$H$_{(7-n)}$F$_n$—, wherein n is an integer ranging from 0 to 7,
—C$_{14}$H$_{(8-n)}$F$_n$—, wherein n is an integer ranging from 0 to 8,
—C$_{16}$H$_{(10-n)}$F$_n$—, wherein n is an integer ranging from 0 to 10,
—(C$_6$H$_{(4-n)}$F$_n$)—(C$_{10}$H$_{(6-m)}$F$_m$)—, where n is an integer of from 1 to 4 and m is an integer of from 1 to 6, and —(C$_{14}$H$_{(8-n)}$F$_n$)—(C$_{16}$H$_{(10-m)}$F$_m$)—, wherein n is an integer of from 1 to 8, and m is an integer of from 1 to 10, said polymer film made from a cyclic precursor.

* * * * *